(12) United States Patent
Noshiro

(10) Patent No.: US 8,482,953 B2
(45) Date of Patent: Jul. 9, 2013

(54) COMPOSITE RESISTANCE VARIABLE ELEMENT AND METHOD FOR MANUFACTURING THE SAME

(75) Inventor: Hideyuki Noshiro, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 61 days.

(21) Appl. No.: 13/194,029

(22) Filed: Jul. 29, 2011

(65) Prior Publication Data

US 2011/0280064 A1 Nov. 17, 2011

Related U.S. Application Data

(63) Continuation of application No. PCT/JP2009/054812, filed on Mar. 12, 2009.

(51) Int. Cl.
*G11C 11/22* (2006.01)

(52) U.S. Cl.
USPC .................. 365/145; 365/163; 365/158

(58) Field of Classification Search
USPC .................. 365/145, 163, 158, 171, 173
See application file for complete search history.

(56) References Cited

U.S. PATENT DOCUMENTS

| | | | |
|---|---|---|---|
| 6,572,917 B2 | 6/2003 | Narisawa et al. | |
| 7,242,469 B2 | 7/2007 | Wang et al. | |
| 7,251,157 B2 | 7/2007 | Osada et al. | |
| 7,286,378 B2* | 10/2007 | Nazarian | 365/46 |
| 7,379,328 B2 | 5/2008 | Osada et al. | |
| 7,384,792 B1 | 6/2008 | Wang et al. | |
| 7,397,688 B2 | 7/2008 | Tajiri | |
| 7,428,046 B2 | 9/2008 | Wang et al. | |
| 7,433,220 B2* | 10/2008 | Shiimoto et al. | 365/145 |
| 7,453,111 B2* | 11/2008 | Ryoo et al. | 257/295 |
| 7,460,224 B2 | 12/2008 | Wang et al. | |
| 7,576,854 B2 | 8/2009 | Wang et al. | |
| 7,790,469 B2 | 9/2010 | Wang et al. | |
| 7,812,938 B2 | 10/2010 | Guo et al. | |
| 7,892,489 B2 | 2/2011 | Wang et al. | |
| 7,927,133 B2 | 4/2011 | Bianchi | |
| 2003/0026894 A1 | 2/2003 | Narisawa et al. | |

(Continued)

FOREIGN PATENT DOCUMENTS

| | | |
|---|---|---|
| JP | 3531628 B2 | 5/2004 |
| JP | 2004-158804 A | 6/2004 |

(Continued)

OTHER PUBLICATIONS

Notification of Transmittal of Translation of the International Preliminary Report on Patentability (Form PCT/IB/338) of International Application No. PCT/JP2009/054812 mailed Oct. 27, 2011 with Forms PCT/IB/373 and PCT/ISA/237.

(Continued)

*Primary Examiner* — Son Dinh
(74) *Attorney, Agent, or Firm* — Westerman, Hattori, Daniels & Adrian, LLP

(57) ABSTRACT

A composite resistance variable element includes a first resistance variable element in which a resistance value varies corresponding to a direction of inner magnetization, and a second resistance variable element connected in series to the first resistance variable element. A resistance value of the second resistance variable element varies corresponding to a magnitude of at least one of a voltage applied to the second resistance variable element and a current flowing through the second resistance variable element, irrespective of whether the voltage and the current are positive or negative.

20 Claims, 24 Drawing Sheets

U.S. PATENT DOCUMENTS

| | | |
|---|---|---|
| 2004/0090815 A1 | 5/2004 | Tajiri |
| 2004/0245557 A1 | 12/2004 | Seo et al. |
| 2005/0201182 A1 | 9/2005 | Osada et al. |
| 2005/0206892 A1 | 9/2005 | Wang et al. |
| 2005/0237788 A1 | 10/2005 | Kano et al. |
| 2007/0114587 A1 | 5/2007 | Seo et al. |
| 2007/0140900 A1 | 6/2007 | Wang et al. |
| 2007/0153267 A1 | 7/2007 | Wang et al. |
| 2007/0153269 A1 | 7/2007 | Wang et al. |
| 2007/0187801 A1 | 8/2007 | Asao et al. |
| 2007/0229817 A1 | 10/2007 | Wang et al. |
| 2007/0263433 A1 | 11/2007 | Osada et al. |
| 2008/0170432 A1 | 7/2008 | Asao |
| 2008/0309918 A1 | 12/2008 | Guo et al. |
| 2009/0046284 A1 | 2/2009 | Wang et al. |
| 2009/0066946 A1 | 3/2009 | Wang et al. |
| 2009/0086202 A1 | 4/2009 | Wang et al. |
| 2010/0070197 A1 | 3/2010 | Wang et al. |
| 2010/0085564 A1 | 4/2010 | Guo et al. |
| 2010/0110424 A1 | 5/2010 | Wang et al. |
| 2010/0114514 A1 | 5/2010 | Wang et al. |
| 2010/0296086 A1 | 11/2010 | Wang et al. |

FOREIGN PATENT DOCUMENTS

| | | |
|---|---|---|
| JP | 2004-363604 A | 12/2004 |
| JP | 2005-260014 A | 9/2005 |
| JP | 2005-310829 A | 11/2005 |
| JP | 2007-214419 A | 8/2007 |
| JP | 2007-258533 A | 10/2007 |
| JP | 2008-085219 A | 4/2008 |
| JP | 2008-177276 A | 7/2008 |

OTHER PUBLICATIONS

International Search Report for PCT/JP2009/054812, mailing date of Jun. 16, 2009.

* cited by examiner

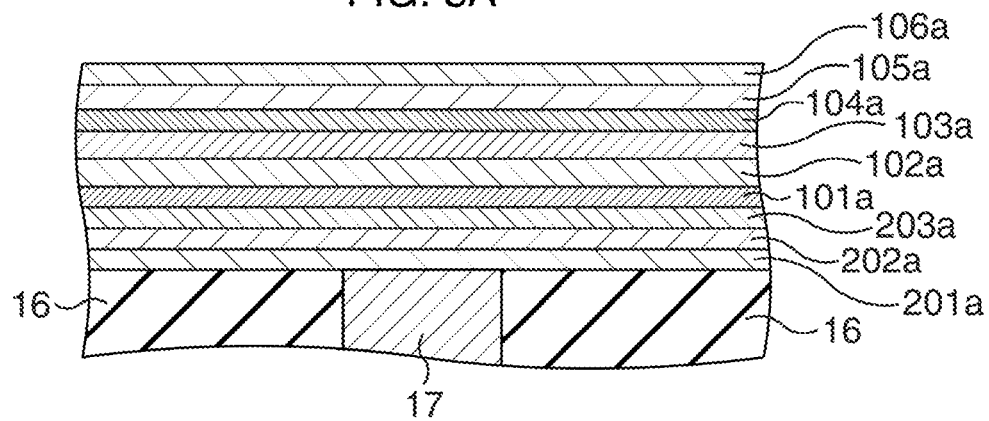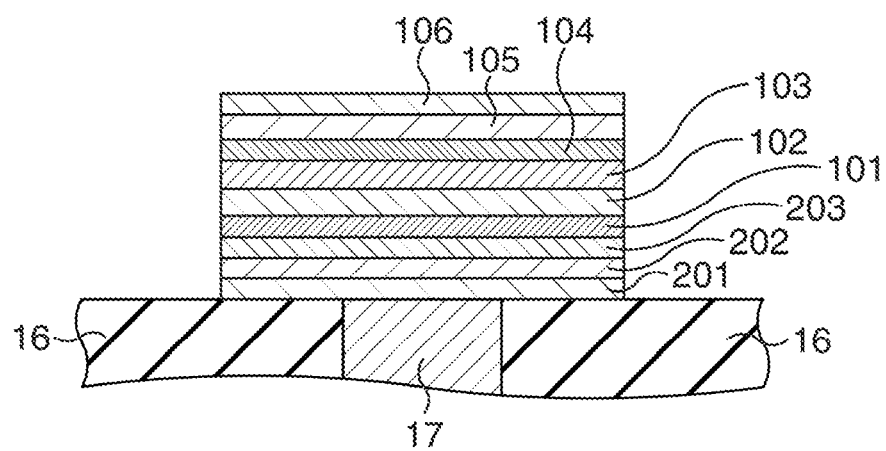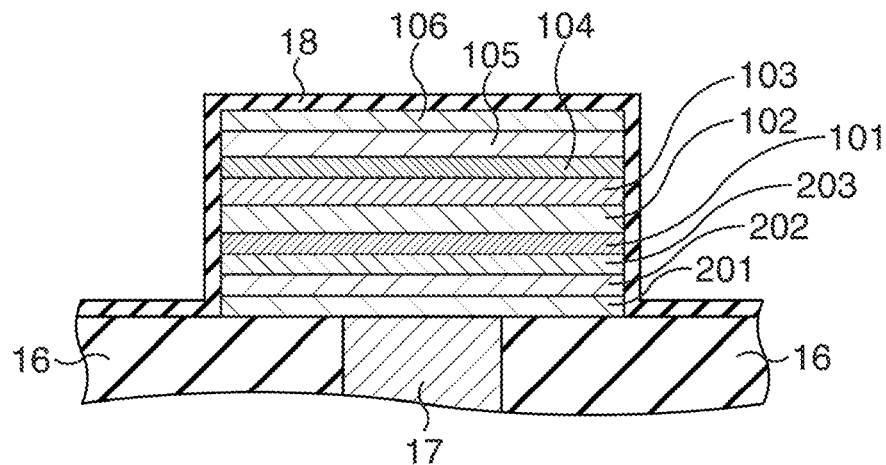

COMPOSITE RESISTANCE VARIABLE ELEMENT AND METHOD FOR MANUFACTURING THE SAME

CROSS-REFERENCE TO RELATED APPLICATION

This application is a Continuation of International Application No. PCT/JP2009/054812, with an international filing date of Mar. 12, 2009, which designating the United States of America, the entire contents of which are incorporated herein by reference.

FIELD

The present embodiments relate to a composite resistance variable element and a method for manufacturing the same.

BACKGROUND

Regarding semiconductor memory devices (memories), studies on MRAM (Magnetic Random Access Memory), ReRAM (Resistive Random Access Memory) and PCRAM (Phase Change Random Access Memory), and the like are performed. In these memories, a resistance variable element is structured such that two states, a high resistance state and a low resistance state, of electric resistance occur, with which binary values ("0" and "1") can be stored. The MRAM stores information using a change in magnetic resistance accompanying a change in magnitude of current. The ReRAM stores information using a change in resistance accompanying a change in magnitude of current and voltage. The PCRAM stores information using a change in resistance accompanying a change in crystal phase.

In the MRAM, for example, a magneto-resistance variable element such as TMR (Tunnel Magneto-Resistance) element is provided in each memory cell. The TMR element is provided with a ferromagnetic layer (fixed layer) in which the direction of magnetization is fixed, a ferromagnetic layer (free layer) in which the direction of magnetization is variable, and an insulating layer (barrier layer) formed between these layers. Such a TMR element turns to a low resistance state when the direction of magnetization of the free layer coincides (in parallel) with the direction of magnetization of the fixed layer, and turns to a high resistance state when the direction of magnetization of the free layer is reverse (anti-parallel) to the direction of magnetization of the fixed layer. As a method of changing the direction of magnetization of the free layer, there is a method to pass a current through a specific wiring (occasionally called a write word line) provided in each memory cell, so as to apply magnetization accompanying this current to the free layer. A structure employing this method is occasionally called a write wiring type. Further, there is also a method to pass a current directly to the TMR element so as to use a spin-torque effect generated accompanying this current. A structure employing this method is occasionally called a spin-injection type. In addition, the current needed for changing the direction of magnetization of the free layer is proportional to the size of the element. Unlike the structure employing the method to apply magnetization accompanying a current, the spin-injection type does not need the wiring (write word line) for controlling the direction of magnetization. Accordingly, this type is preferable for densification. Further, as described above, since the current needed for changing the direction of magnetization of the free layer is proportional to the size of the element, it is possible to reduce the current needed for writing information as the device is miniaturized. Therefore, in recent years, MRAMs of the spin-injection type are gaining attention.

In the ReRAM, a resistance variable element in which an electric resistance varies accompanying a change in magnitude of current and voltage is provided in each memory cell. The resistance variable element is provided with two electrodes and a resistance variable film provided between the electrodes. The resistance of the resistance variable film varies corresponding to the magnitude of current, and an oxide containing transition metal such as a nickel oxide is used for its material.

The PCRAM is occasionally called a phase change memory. In the PCRAM, a resistance variable element in which electric resistance changes accompanying a change in crystal phase is provided in each memory cell. The resistance variable element is provided with a phase change layer formed of a material which turns to an amorphous state or a crystal state accompanying a temperature change or the like. Such a phase change layer turns to a high resistance state when it is in the amorphous state and to a low resistance state when it is in the crystal state. A method for changing the phase is to pass a current and use the Joule heat generated by this current. When the phase change layer is in the amorphous state (high resistance state), a voltage is applied to this layer to pass a current. When the current increases to a certain degree, the phase change layer is heated by the Joule heat and changes to the crystal state (low resistance state). When the voltage is decreased from this state, the crystal state is maintained. On the other hand, when the phase change layer is in the crystal state (low resistance state), passing a current at a predetermined level or higher to this layer causes the crystal to melt, and the phase change layer changes to the amorphous state (high resistance state). Moreover, the voltage increases accompanying the change to the high resistance state, and the current decreases. Then, as the voltage is decreased from this state, the amorphous state is maintained.

In this way, conventionally, binary information is stored in one memory cell.

On the other hand, to store quaternary information in one memory cell, a structure in which two phase change layers are provided in one memory cell is proposed.

However, although there are four types of combinations of states of phases in the two phase change layers, it is not possible to change among these four types of states only by single processing. For example, although it is possible to change from one state to another state by single processing, it is not possible to cause a reverse change by single processing, and it is occasionally necessary to further go through another state in the middle. Accordingly, control becomes complicated.

Patent Document 1: Japanese Patent No. 3531628
Patent Document 2: Japanese Laid-open Patent Publication No. 2004-158804
Patent Document 3: Japanese Laid-open Patent Publication No. 2004-363604
Patent Document 4: Japanese Laid-open Patent Publication No. 2005-260014

SUMMARY

In one aspect of a composite resistance variable element, there are provided a first resistance variable element in which a resistance value varies corresponding to a direction of inner magnetization, and a second resistance variable element connected in series to the first resistance variable element. A resistance value of the second resistance variable element varies corresponding to a magnitude of at least one of a voltage applied to the second resistance variable element and a current flowing through the second resistance variable element, irrespective of whether the voltage and the current are positive or negative.

In one aspect of a method for manufacturing a composite resistance variable element, a first resistance variable element in which a resistance value varies corresponding to a direction of inner magnetization is formed, and a second resistance variable element connected in series to the first resistance variable element is formed. A resistance value of the second resistance variable element varies corresponding to a magnitude of at least one of a voltage applied to the second resistance variable element and a current flowing through the second resistance variable element, irrespective of whether the voltage and the current are positive or negative.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 8A to 8E are cross-sectional views illustrating a method for forming the magneto-resistance variable element 1 and the resistance variable element 2 in the first embodiment in the order of processes;

DESCRIPTION OF EMBODIMENTS

Hereinafter, embodiments will be described specifically with reference to the attached drawings.

First Embodiment

Figure 1:
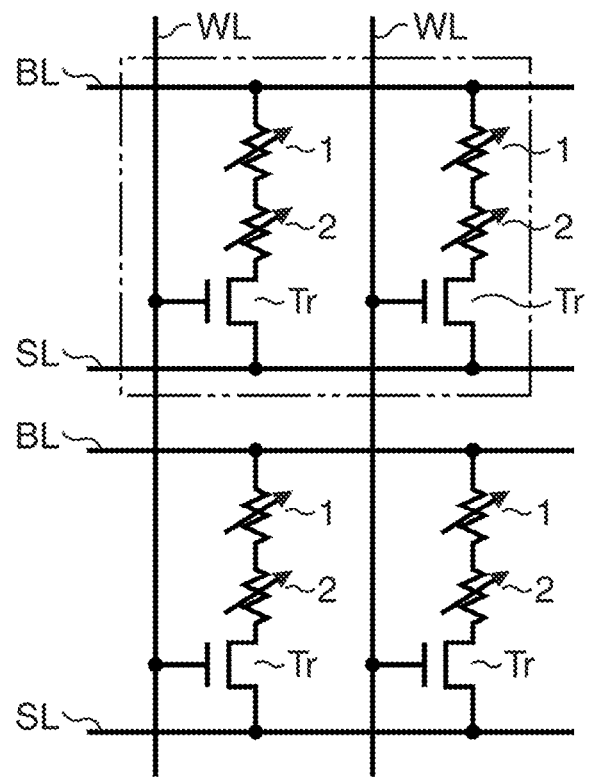
FIG. 1 is a circuit diagram illustrating a part of a semiconductor memory device according to a first embodiment.
Figure 2:
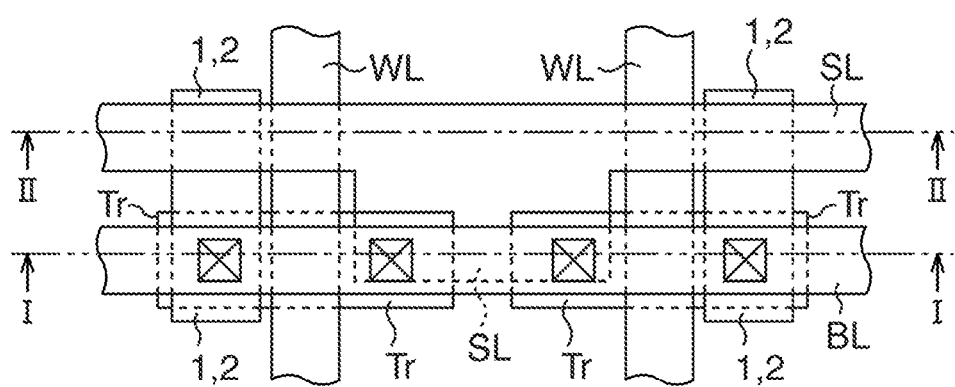
FIG. 2 is a diagram illustrating a layout of a part indicated by two-dot chain lines in FIG. 1.

To begin with, a first embodiment will be described. FIG. 1 is a circuit diagram illustrating a part of a semiconductor memory device according to the first embodiment. FIG. 2 is a diagram illustrating a layout of a part indicated by two-dot chain lines in FIG. 1.

In the first embodiment, plural memory cells are disposed vertically and horizontally in an array. FIG. 1 illustrates four of them, and FIG. 2 illustrates two of them. Each memory cell is provided with a word line WL, a bit line BL, and a signal line SL. For example, the word line WL is shared by plural memory cells which are aligned vertically, and the bit line BL and the signal line SL are shared by plural memory cells which are aligned horizontally. Further, each memory cell is provided with a magneto-resistance variable element 1, a resistance variable element 2, and a transistor Tr. The word line WL doubles as a gate electrode of the transistor Tr. One of a source and a drain of the transistor Tr is connected to the signal line SL, and the other is connected to one electrode of the resistance variable element 2. The other electrode of the resistance variable element 2 is connected to one electrode of the magneto-resistance variable element 1. The other electrode of the magneto-resistance variable element 1 is connected to the bit line BL. A composite resistance variable element includes the magneto-resistance variable element 1 and the resistance variable element 2.

Figure 3A:
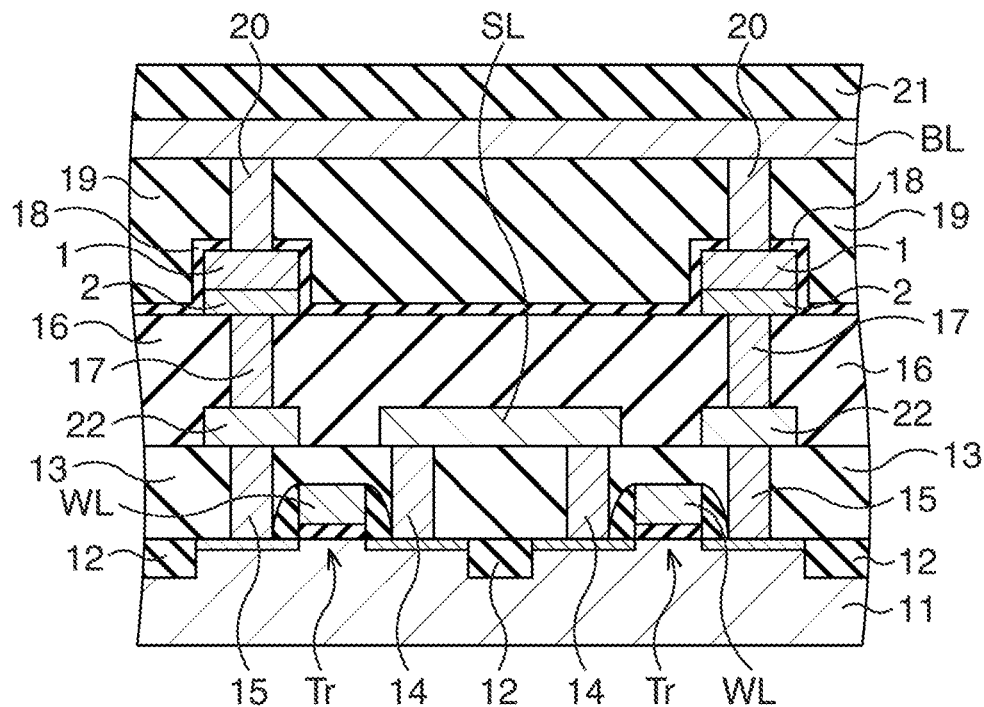
FIG. 3A is a cross-sectional view taken along a line I-I of FIG. 2 in the first embodiment.
Figure 3B:
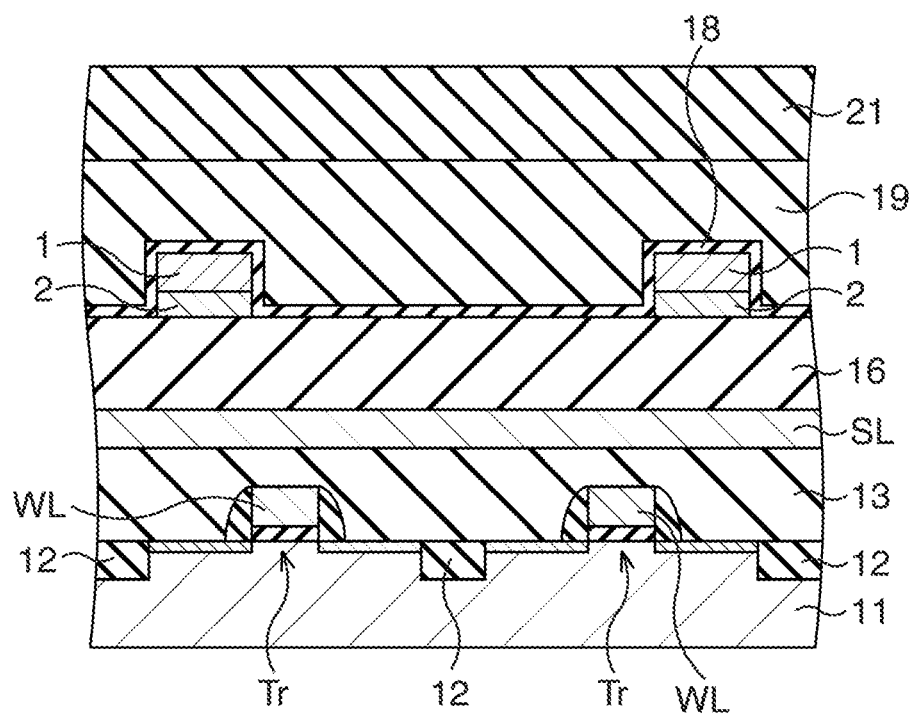
FIG. 3B is a cross-sectional view taken along a line II-II of FIG. 2 in the first embodiment.

Next, a cross-sectional structure of the first embodiment will be described. FIG. 3A is a cross-sectional view taken along a line I-I of FIG. 2 in the first embodiment. FIG. 3B is a cross-sectional view taken along a line II-II of FIG. 2 in the first embodiment. Here, one memory cell will be described.

In the first embodiment, as illustrated in FIG. 3A and FIG. 3B, an element isolation insulating film 12 defining an element region is formed in a surface of a semiconductor substrate 11 such as a silicon substrate by an STI (shallow trench isolation) method or the like. The transistor Tr is formed in the element region. An interlayer insulating film 13 covering the transistor Tr is formed over the semiconductor substrate 11, and a plug 14 connected to one of the source and the drain of the transistor Tr and a plug 15 connected to the other thereof are formed in the interlayer insulating film 13. The signal line SL and a conductive layer 22 are formed on the interlayer insulating film 13. The signal line SL is connected to the plug 14, and the conductive layer 22 is connected to the plug 15. An interlayer insulating film 16 covering the signal line SL and the conductive layer 22 is formed over the interlayer insulating film 13. A plug 17 connected to the conductive layer 22 is formed in the interlayer insulating film 16.

On the interlayer insulating film 16, the resistance variable element 2 is formed with one electrode (bottom electrode) connected to the plug 17. Further, on the resistance variable element 2, the magneto-resistance variable element 1 is formed with one electrode (bottom electrode) connected to the other electrode (top electrode) of the resistance variable element 2. A silicon nitride film 18 covering the resistance variable element 2 and the magneto-resistance variable element 1 is formed as a protective film over the interlayer insulating film 16. The thickness of the silicon nitride film 18 is about 20 nm to 50 nm for example. An interlayer insulating film 19 is formed over the silicon nitride film 18. A plug 20 connected to the other electrode (top electrode) of the magneto-resistance variable element 1 is formed in the silicon nitride film 18 and the interlayer insulating film 19. The bit line BL connected to the plug 20 is formed on the interlayer insulating film 19. An interlayer insulating film 21 covering the bit line BL is formed over the interlayer insulating film 19. Other wirings, a passivation film, and so on are formed above the interlayer insulating film 21.

Figure 4:
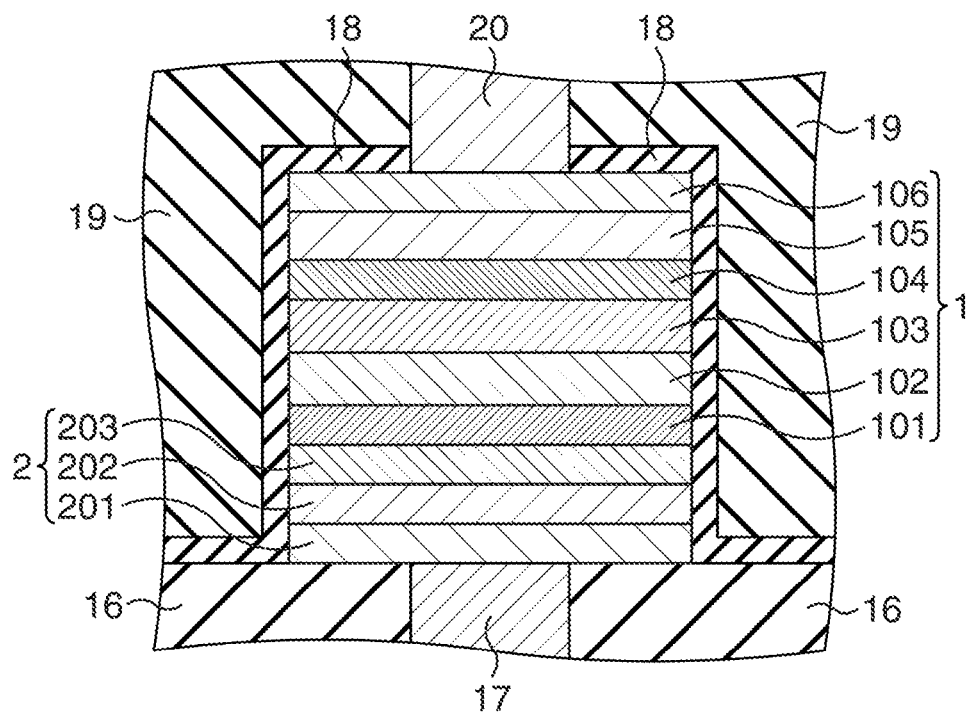
FIG. 4 is a cross-sectional view illustrating structures of a magneto-resistance variable element 1 and a resistance variable element 2 in the first embodiment.

Next, the structures of the magneto-resistance variable element 1 and the resistance variable element 2 will be described. FIG. 4 is a cross-sectional view illustrating the structures of the magneto-resistance variable element 1 and the resistance variable element 2 in the first embodiment.

As illustrated in FIG. 4, the resistance variable element 2 includes a bottom electrode 201 on the interlayer insulating film 16 and contacting the plug 17, a resistance variable film 202 on the bottom electrode 201, and a top electrode 203 on the resistance variable film 202. The bottom electrode 201 includes, for example, a Ti nitride film with a thickness of about 5 nm to 50 nm (for example, 5 nm), and a Ni film thereon with a thickness of about 5 nm to 50 nm (for example, 20 nm). As the resistance variable film 202, for example, a Ni oxide film with a thickness of about 2 nm to 20 nm (for example, 5 nm) is used. As the top electrode 203, for example, a Pt film with a thickness of about 2 nm to 50 nm (for example, 5 nm) is used.

The magneto-resistance variable element 1 includes a bottom electrode 101 contacting the top electrode 203 of the resistance variable element 2, as well as an antiferromagnetic layer 102, a fixed magnetic layer 103, a tunnel oxide film 104, a free magnetic layer 105, and a top electrode 106, which are stacked sequentially on the bottom electrode 101. As the bottom electrode 101, for example, a Ta film with a thickness of about 5 nm to 50 nm (5 nm for example) is used. As the antiferromagnetic layer 102, for example, a PtMn film with a thickness of about 10 nm to 30 nm (for example, 15 nm) is used. As the fixed magnetic layer 103, for example, a CoFeB film with a thickness of about 2 nm to 4 nm (for example, 3 nm) is used. As the tunnel oxide film 104, for example, an Mg oxide film with a thickness of about 0.5 nm to 2 nm (for example, 1 nm) is used. As the free magnetic layer 105, for example, a CoFeB film with a thickness of about 1 nm to 3 nm (for example, 2 nm) is used. The top electrode 106 includes, for example, a Ru film with a thickness of about 1 nm to 15 nm (for example, 10 nm) and a Ta film formed thereon with a thickness of about 2 nm to 50 nm (for example, 40 nm).

Figure 5A:
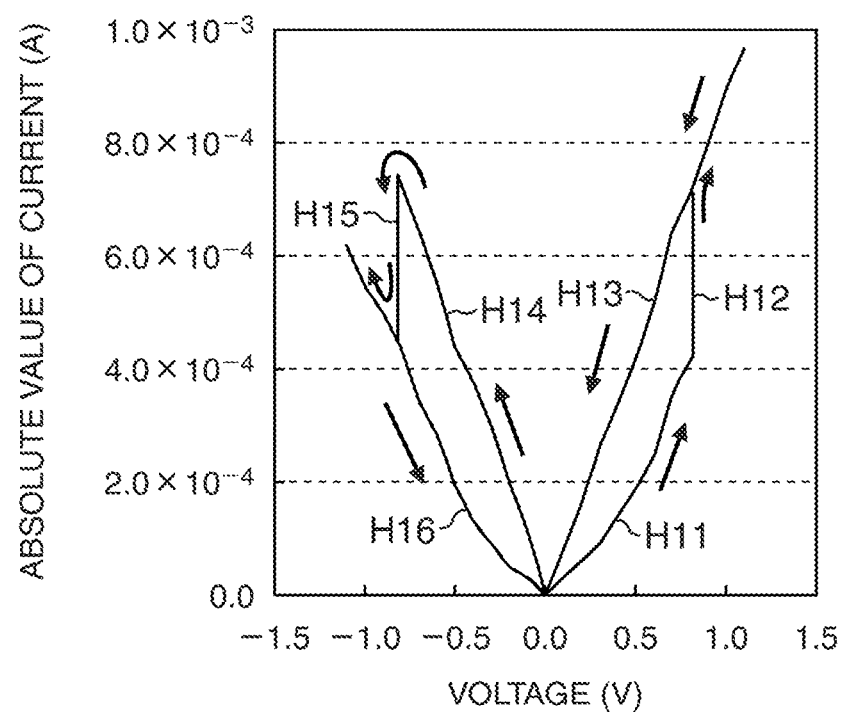
FIG. 5A is a chart illustrating characteristics of the magneto-resistance variable element 1.
Figure 5B:
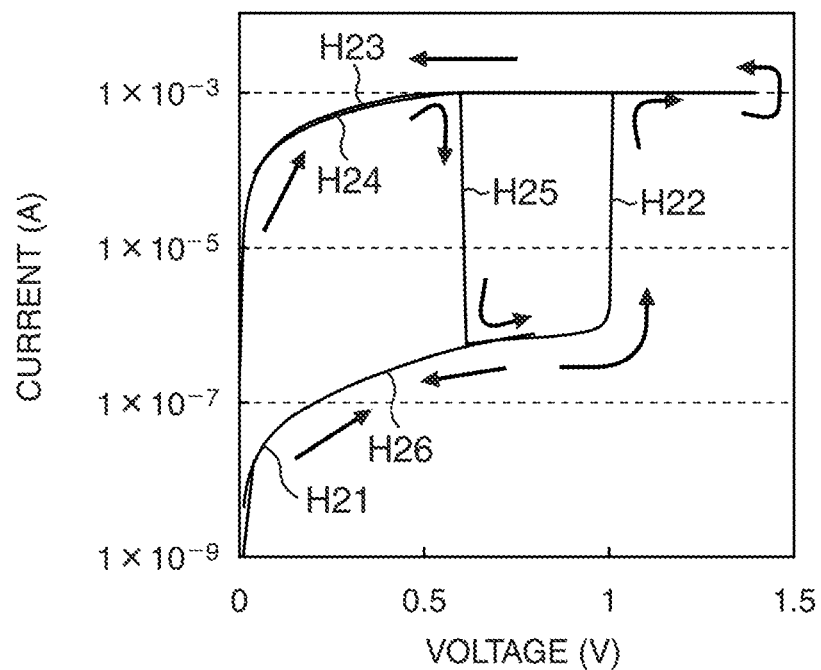
FIG. 5B is a chart illustrating characteristics of the resistance variable element 2.

Here, respective characteristics of the magneto-resistance variable element 1 and the resistance variable element 2 structured as described above will be described. FIG. 5A is a chart illustrating the characteristics of the magneto-resistance variable element 1, and FIG. 5B is a chart illustrating the characteristics of the resistance variable element 2. Here, it is assumed that the resistance value of the magneto-resistance variable element 1 is 1600Ω in a high resistance state and 1000Ω in a low resistance state, and that the resistance value of the resistance variable element 2 is 5000Ω in a high resistance state and 50Ω in a low resistance state.

First, it is assumed that the magneto-resistance variable element 1 is in the high resistance state. That is, the direction of magnetization of the free magnetic layer 105 is antiparallel to the direction of magnetization of the fixed magnetic layer 103. In this state, when a positive voltage (which causes the potential of the bottom electrode 101 to be lower than the potential of the top electrode 106) is applied to the magneto-resistance variable element 1, the current increases along a hysteresis line H11 as illustrated in FIG. 5A. When the voltage reaches about 0.8 V, the direction of magnetization of the free magnetic layer 105 reverses and becomes parallel to the direction of magnetization of the fixed magnetic layer 103. As a result, the magneto-resistance variable element 1 changes to the low resistance state, and the current increases rapidly (hysteresis line H12). Thereafter, when the voltage is decreased to 0 V, the current decreases along a hysteresis line H13. Thus, the magneto-resistance variable element 1 in the low resistance state is obtained.

Further, when a negative voltage (which causes the potential of the bottom electrode 101 to be higher than the potential of the top electrode 106) is applied to the magneto-resistance variable element 1 in the low resistance state, the absolute value of the current increases along a hysteresis line H14 (the current is negative) as illustrated in FIG. 5A. When the voltage reaches about −0.8 V, the direction of magnetization of the free magnetic layer 105 reverses and becomes antiparallel to the direction of magnetization of the fixed magnetic layer 103. As a result, the magneto-resistance variable element 1 changes to the high resistance state, and the absolute value of the current decreases rapidly (hysteresis line H15). Thereafter, when the voltage is decreased to 0 V, the current decreases along a hysteresis line H16. Thus, the magneto-resistance variable element 1 in the high resistance state is obtained.

Next, it is assumed that the resistance variable element 2 is in the high resistance state. In this state, when a positive voltage (which causes the potential of the bottom electrode 201 to be lower than the potential of the top electrode 203) is applied to the resistance variable element 2, the current increases along a hysteresis line H21 as illustrated in FIG. 5B. When the voltage reaches about 1 V, the state of the resistance variable film 202 changes and the resistance variable element 2 turns to the low resistance state, and the current increases rapidly (hysteresis line H22). Thereafter, when the voltage is decreased to 0 V, the current decreases along a hysteresis line H23. Thus, the resistance variable element 2 in the low resistance state is obtained. Here, the current is not higher than 1 $10^{-3}$ A, which is because a current limitation is imposed thereon. If the current limitation is not imposed, a large current may flow to the resistance variable film 202 and destroy this film.

Further, when the positive voltage is applied to the resistance variable element 2 in the low resistance state, the current increases along a hysteresis line H24 as illustrated in FIG. 5B. When the current reaches about 1 $10^{-3}$ A, the state of the resistance variable film 202 changes, the resistance variable element 2 changes to the high resistance state, and the current decreases rapidly (hysteresis line H25). Thereafter, when the voltage is decreased to 0 V, the current decreases along a hysteresis line H26. Thus, the resistance variable element 2 in the high resistance state is obtained.

In addition, when a negative voltage is applied to the resistance variable element 2, characteristics similar to those illustrated in FIG. 5B appear. This means that the characteristics of the resistance variable element 2 are not affected by the polarity of voltage and the direction of current.

Figure 6A:
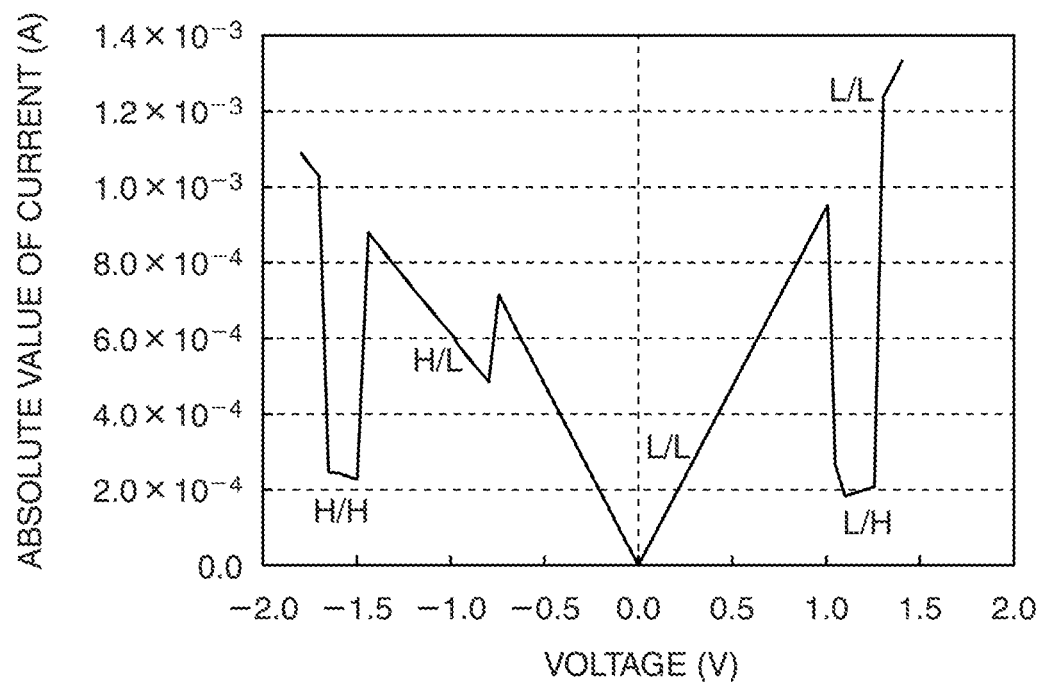
FIG. 6A is a chart illustrating a characteristic when both the magneto-resistance variable element 1 and the resistance variable element 2 are in a low resistance state (L/L) in an initial state.
Figure 6B:
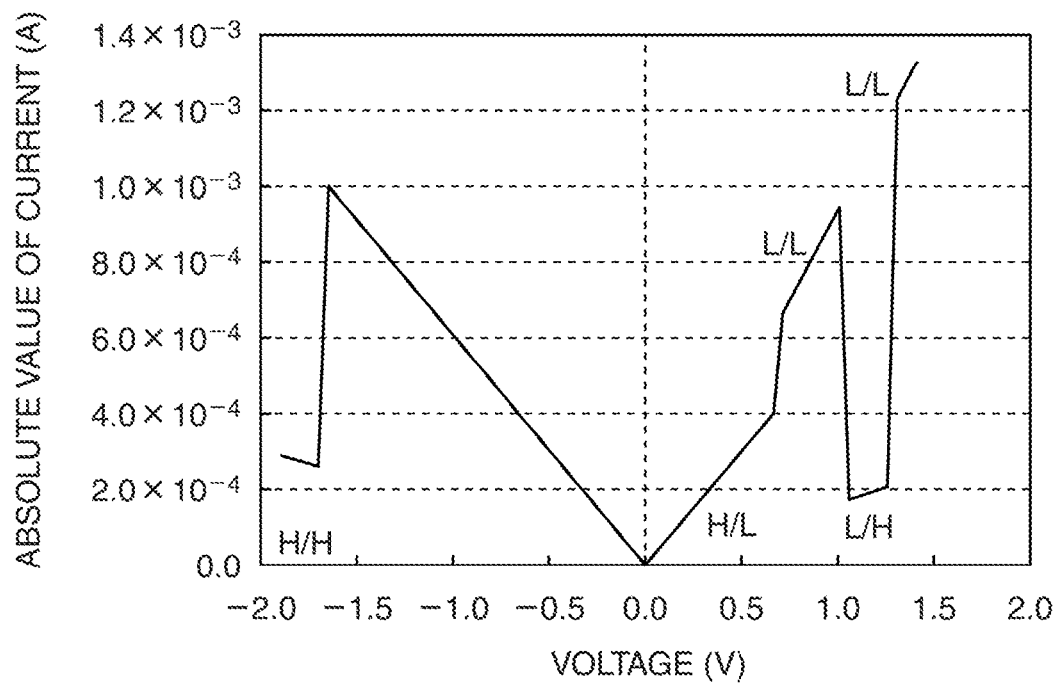
FIG. 6B is a chart illustrating a characteristic when the magneto-resistance variable element 1 is in a high resistance state and the resistance variable element 2 is in the low resistance state (H/L) in the initial state.
Figure 6C:
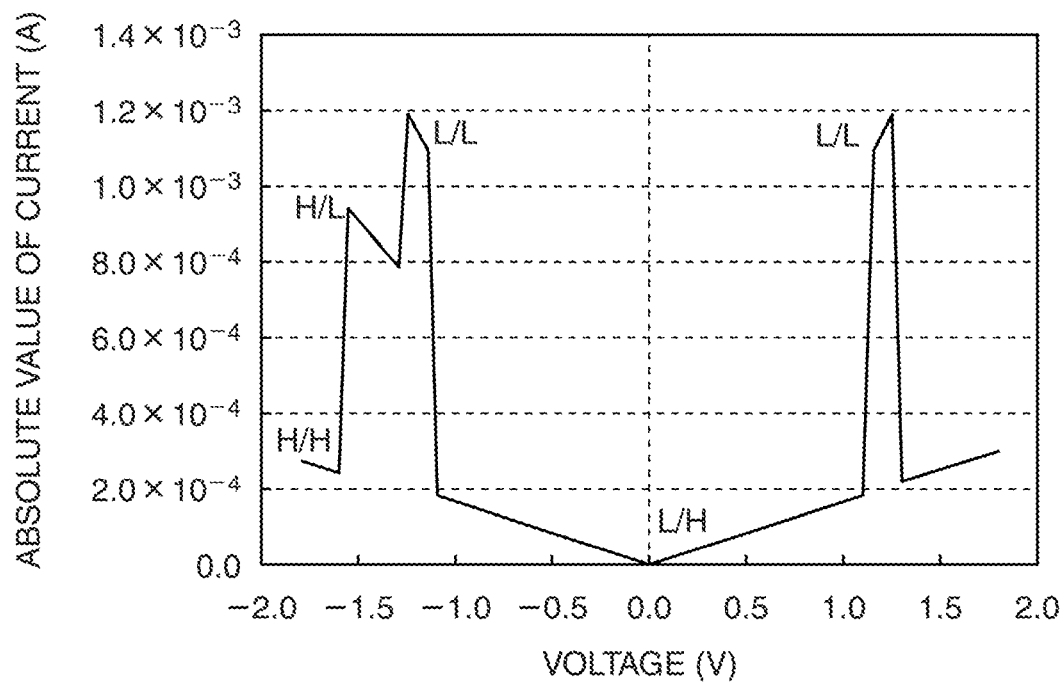
FIG. 6C is a chart illustrating a characteristic when the magneto-resistance variable element 1 is in the low resistance state and the resistance variable element 2 is in the high resistance state (L/H) in the initial state.
Figure 6D:
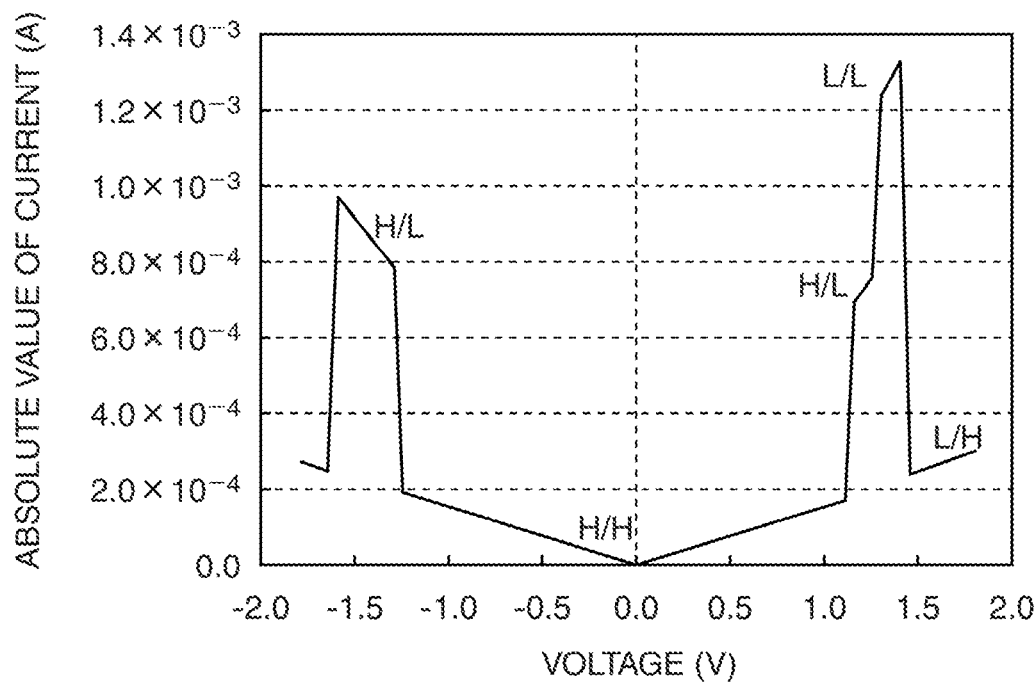
FIG. 6D is a chart illustrating a characteristic when both the magneto-resistance variable element 1 and the resistance variable element 2 are in the high resistance state (H/H) in the initial state.

Such characteristics appear when the magneto-resistance variable element 1 and the resistance variable element 2 are controlled individually. However, in this embodiment, a voltage is applied simultaneously to the magneto-resistance variable element 1 and the resistance variable element 2, which are connected in series with each other. Accordingly, to the magneto-resistance variable element 1 and the resistance variable element 2, divided voltages corresponding to resistance values of both the elements are applied. Assuming that a voltage which causes the potential of the bottom electrode 201 to become lower than that of the top electrode 106 is defined as the positive voltage, a relation illustrated in FIG. 6A to FIG. 6D appears between this voltage and the absolute value of the current detected in the signal line SL. FIG. 6A illustrates a characteristic when both the magneto-resistance variable element 1 and the resistance variable element 2 are in the low resistance state (L/L) in an initial state. FIG. 6B illustrates a characteristic when the magneto-resistance variable element 1 is in the high resistance state and the resistance variable element 2 is in the low resistance state (H/L) in the initial state. FIG. 6C illustrates a characteristic when the magneto-resistance variable element 1 is in the low resistance state and the resistance variable element 2 is in the high resistance state (L/H) in the initial state. FIG. 6D illustrates a characteristic when both the magneto-resistance variable element 1 and the resistance variable element 2 are in the high resistance state (H/H) in the initial state.

As illustrated in FIG. 6A, when the positive voltage is applied (the signal line SL is grounded and the potential of the bit line BL is turned to positive) to the magneto-resistance variable element 1 and the resistance variable element 2 in the low resistance state (the state of "L/L") in the initial state, the resistance of the resistance variable element 2 becomes high at about 1.0 V. Then, when the voltage is decreased to 0 V, the state of "L/H" is obtained.

Further, when the negative voltage is applied (the signal line SL is grounded and the potential of the bit line BL is turned to negative) to the magneto-resistance variable element 1 and the resistance variable element 2 in the low resistance state in the initial state, the resistance of the magneto-resistance variable element 1 becomes high at about −0.8 V. Then, when the voltage is decreased to 0 V, the state of "H/L" is obtained.

Moreover, when the negative voltage is applied to the magneto-resistance variable element 1 and the resistance variable element 2 in the low resistance state in the initial state, the resistance of the magneto-resistance variable element 1 becomes high at about −0.8 V, and when the negative voltage is increased further, also the resistance of the resistance variable element 2 becomes high at about −1.5 V. Then, when the voltage is decreased to 0 V, the state of "H/H" is obtained.

Thus, when the initial state is "L/L", the state of "L/H", the state of "H/L", and the state of "H/H" are obtained by applying three types of voltages only once.

As illustrated in FIG. 6B, when the positive voltage is applied to the magneto-resistance variable element 1 in the high resistance state and the resistance variable element 2 in the low resistance state (the state of "H/L") in the initial state, the resistance of the magneto-resistance variable element 1 becomes low at about 0.7 V. Then, when the voltage is decreased to 0 V, the state of "L/L" is obtained.

Further, when the positive voltage is applied to the magneto-resistance variable element 1 in the high resistance state and the resistance variable element 2 in the low resistance state in the initial state, the resistance of the magneto-resistance variable element 1 becomes low at about 0.7 V, and when the positive voltage is increased further, the resistance of the resistance variable element 2 becomes high at about 1.0 V. Then, when the voltage is decreased to 0 V, the state of "L/H" is obtained.

Moreover, when the negative voltage is applied to the magneto-resistance variable element 1 in the high resistance state and the resistance variable element 2 in the low resistance state in the initial state, the resistance of the resistance variable element 2 becomes high at about −1.7 V. Then, when the voltage is decreased to 0 V, the state of "H/H" is obtained.

Thus, when the initial state is "H/L", the state of "L/L", the state of "L/H", and the state of "H/H" are obtained by applying three types of voltages only once.

As illustrated in FIG. 6C, when the negative voltage is applied to the magneto-resistance variable element 1 in the low resistance state and the resistance variable element 2 in the high resistance state (the state of "L/H") in the initial state, the resistance of the resistance variable element 2 becomes low at about −1.1 V. Then, when the voltage is decreased to 0

V, the state of "L/L" is obtained. In addition, also when the positive voltage is applied, the resistance of the resistance variable element 2 becomes low at about 1.1 V. Then, when the voltage is decreased to 0 V, the state of "L/L" is obtained.

Further, when the negative voltage is applied to the magneto-resistance variable element 1 in the low resistance state and the resistance variable element 2 in the high resistance state in the initial state, the resistance of the resistance variable element 2 becomes low at about −1.1 V, and when the negative voltage is increased further, the resistance of the magneto-resistance variable element 1 becomes high at about −1.3 V. Then, when the voltage is decreased to 0 V, the state of "H/L" is obtained.

Moreover, when the negative voltage is applied to the magneto-resistance variable element 1 in the low resistance state and the resistance variable element 2 in the high resistance state in the initial state, the resistance of the resistance variable element 2 becomes low at about −1.1 V, and the resistance of the magneto-resistance variable element 1 becomes high at about −1.3 V. When the negative voltage is increased further, the resistance of the resistance variable element 2 becomes high at about −1.5 V. Then, when the voltage is decreased to 0 V, the state of "H/H" is obtained.

Thus, when the initial state is "L/H", the state of "L/L", the state of "H/L", and the state of "H/H" are obtained by applying three types of voltages only once.

As illustrated in FIG. 6D, when the positive voltage is applied to the magneto-resistance variable element 1 and the resistance variable element 2 in the high resistance state (the state of "H/H") in the initial state, the resistance of the resistance variable element 2 becomes low at about 1.1 V. Then, when the voltage is decreased to 0 V, the state of "H/L" is obtained. In addition, also when the negative voltage is applied, the resistance of the resistance variable element 2 becomes low at about −1.3 V. Then, when the voltage is decreased to 0 V, the state of "H/L" is obtained.

Further, when the positive voltage is applied to the magneto-resistance variable element 1 and the resistance variable element 2 in the high resistance state in the initial state, the resistance of the resistance variable element 2 becomes low at about 1.1 V, and when the positive voltage is increased further, the resistance of the magneto-resistance variable element 1 becomes low at about 1.3 V. Then, when the voltage is decreased to 0 V, the state of "L/L" is obtained.

Moreover, when the positive voltage is applied to the magneto-resistance variable element 1 and the resistance variable element 2 in the high resistance state in the initial state, the resistance of the resistance variable element 2 becomes low at about 1.1 V, and the resistance of the magneto-resistance variable element 1 becomes low at about 1.3 V. When the positive voltage is increased further, the resistance of the resistance variable element 2 becomes high at about 1.5 V. Then, when the voltage is decreased to 0 V, the state of "L/H" is obtained.

Thus, when the initial state is "H/H", the state of "H/L", the state of "L/L", and the state of "L/H" are obtained by applying three types of voltages only once.

Note that application of these voltages is performed in a state that the transistor Tr is turned on by control via the word line WL.

In this embodiment as described above, there are four combinations of resistance values of the magneto-resistance variable element 1 and the resistance variable element 2, and transition among these combinations can be controlled by only one time of application of voltage. That is, a predetermined combination can be obtained by applying the voltages illustrated in Table 1 only once. Therefore, by applying these four types of states to logic information "00", "01", "10", "11", it becomes possible to store quaternary information in one memory cell.

TABLE 1

| Initial state | Voltages for transition to respective states | | | |
| --- | --- | --- | --- | --- |
| | L/L | H/L | L/H | H/H |
| L/L | — | −0.8 V | +1.0 V | −1.5 V |
| H/L | +0.7 V | — | +1.0 V | −1.7 V |
| L/H | −1.1 V, +1.1 V | −1.3 V | — | −1.5 V |
| H/H | +1.3 V | +1.1 V, −1.3 V | +1.5 V | — |

Further, as illustrated in FIG. 6A to FIG. 6D and Table 1, since the voltage needed for these controls is as low as less than 2 V, a particularly high voltage is not necessary, and thus it is highly compatible with conventional control circuits, voltage circuits, and the like. That is, it is not necessary to add a special structure or the like to a control circuit, a voltage circuit, and the like, and this facilitates designing.

Next, a method for manufacturing the semiconductor memory device according to the first embodiment will be described. FIG. 7A to FIG. 7D are cross-sectional views illustrating the method for manufacturing the semiconductor memory device according to the first embodiment in the order of processes. The cross sections illustrated in FIG. 7A to FIG. 7D correspond to the cross section along the line I-I of FIG. 2.

Figure 7A:
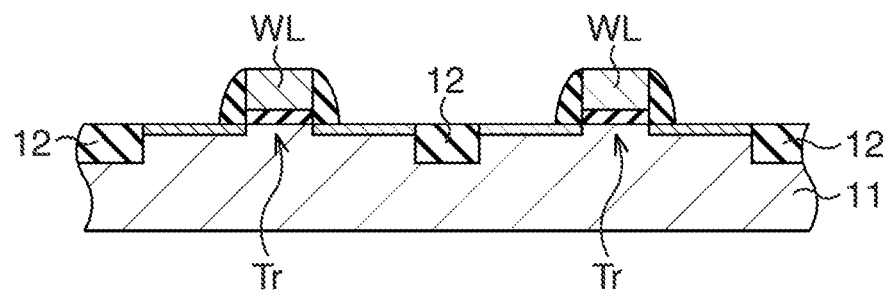
FIGS. 7A to 7D are cross-sectional views illustrating a method for manufacturing the semiconductor memory device according to the first embodiment in the order of processes.

First, as illustrated in FIG. 7A, the element isolation insulating film 12 defining the element region is formed by the STI method or the like in the surface of the semiconductor substrate 11, and the transistor Tr is formed in the element region.

Figure 7B:
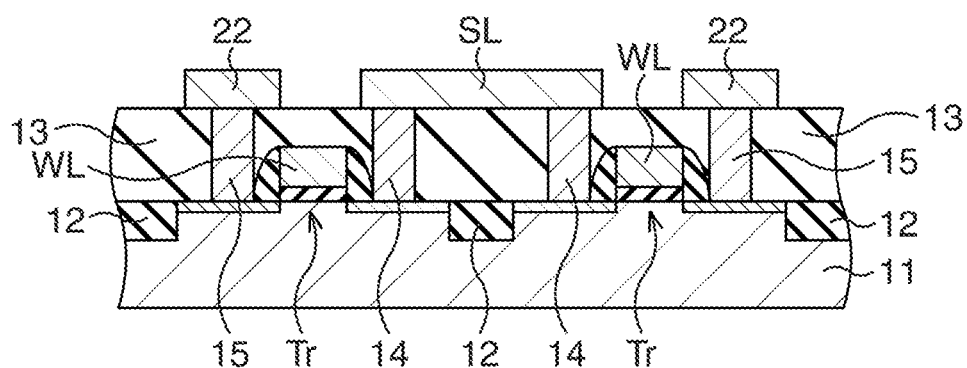

Next, as illustrated in FIG. 7B, the interlayer insulating film 13 is formed over the semiconductor substrate 11. As the interlayer insulating film 13, for example, a silicon oxide film is formed by a chemical vapor deposition (CVD) method. Thereafter, contact holes are formed by photolithography technique and dry etching technique in the interlayer insulating film 13, and the plugs 14 and 15 are formed in the contact holes. In formation of the plugs 14 and 15, for example, a Ti nitride film as a barrier metal film and a tungsten film are formed by a sputtering method or the CVD method, and these films are polished by a chemical mechanical polishing (CMP) method, for example, until the surface of the interlayer insulating film 13 is exposed.

Further, the signal line SL and the conductive layer 22 are formed on the interlayer insulating film 13. In formation of the signal line SL and the conductive layer 22, a conductive film such as an aluminum film or a copper film is formed on the interlayer insulating film 13, and patterning by the photolithography technique and the dry etching technique is performed on this conductive film.

Figure 7C:
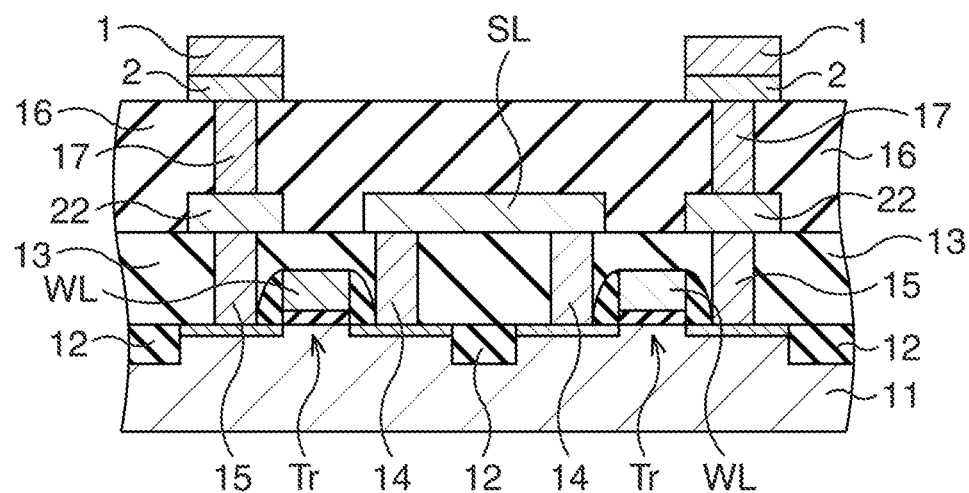

Subsequently, as illustrated in FIG. 7C, the interlayer insulating film 16 is formed over the interlayer insulating film 13. As the interlayer insulating film 16, for example, a silicon oxide film is formed by the CVD method. Then, a contact hole is formed by the photolithography technique and the dry etching technique in the interlayer insulating film 16, and the plug 17 is formed in the contact hole. In formation of the plug 17, for example, a Ti nitride film as a barrier metal film and a tungsten film are formed by the sputtering method or the CVD method, and these films are polished by the CMP method, for example, until the surface of the interlayer insulating film 16 is exposed.

It should be noted that formation of the signal line SL and the conductive layer 22 may be performed by a damascene method. In this case, for example, first, a part (lower layer part) of the interlayer insulating film 16 is formed with a thickness equal to that of the signal line SL and the conductive layer 22, and a wiring trench is formed in this part. Then, a seed film is formed by the sputtering method in the wiring trench, a copper film is formed thereon by a plating method, and thereafter polishing by the CMP method is performed. Then, the remaining part (upper layer part) of the interlayer insulating film 16 is formed thereon. Likewise, formation of the plug 17 may be performed by the damascene method. In this case, for example, a contact hole is formed in the interlayer insulating film 16. Thereafter, a seed film is formed by the sputtering method in the contact hole, a copper film is formed thereon by the plating method, and subsequently polishing by the CMP method is performed.

Further, the resistance variable element 2 and the magneto-resistance variable element 1 are formed on the interlayer insulating film 16. A method for forming the resistance variable element 2 and the magneto-resistance variable element 1 will be described later.

Figure 7D:
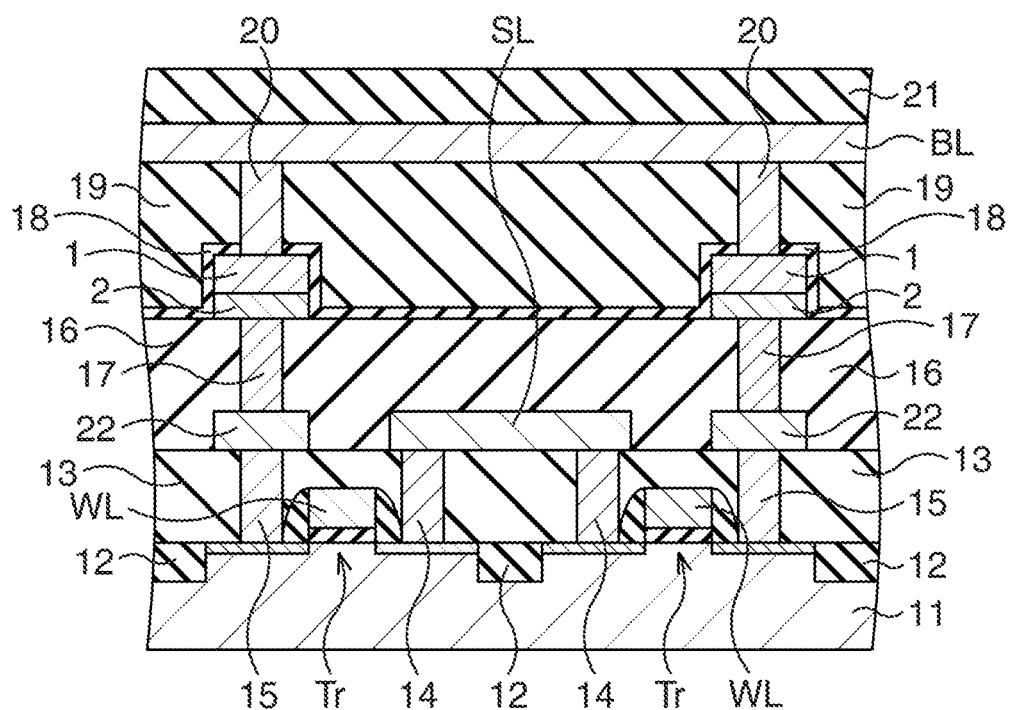

Thereafter, as illustrated in FIG. 7D, the silicon nitride film 18 as a protective film is formed over the interlayer insulating film 16, and the interlayer insulating film 19 is formed over the silicon nitride film 18. The silicon nitride film 18 is formed by the sputtering method or the CVD method for example. As the interlayer insulating film 19, a silicon oxide film is formed by the CVD method for example.

Subsequently, a contact hole is formed in the interlayer insulating film 19 and the silicon nitride film 18 by the photolithography technique and the dry etching technique, and the plug 20 is formed in the contact hole. In formation of the plug 20, for example, a Ti nitride film as a barrier metal film and a tungsten film are formed by the sputtering method or the CVD method, and these films are polished by the CMP method for example until the surface of the interlayer insulating film 19 is exposed.

Further, the bit line BL is formed on the interlayer insulating film 19. In formation of the bit line BL, a conductive film such as an aluminum film or a copper film is formed on the interlayer insulating film 19, and patterning by the photolithography technique and the dry etching technique is performed on this conductive film. After the bit line BL is formed, the interlayer insulating film 21 is formed over the interlayer insulating film 19. As the interlayer insulating film 21, a silicon oxide film is formed by the CVD method for example.

Thereafter, other wirings, a passivation film, and so on are formed above the interlayer insulating film 21, thereby completing the semiconductor memory device.

Here, a method for forming the magneto-resistance variable element 1 and the resistance variable element 2 in the first embodiment will be described. FIG. 8A to FIG. 8E are cross-sectional views illustrating the method for forming the magneto-resistance variable element 1 and the resistance variable element 2 in the first embodiment in the order of processes.

First, as illustrated in FIG. 8A, a stacked film 201a of a Ti nitride film and a Ni film, a Ni oxide film 202a, and a Pt film 203a are formed sequentially over the interlayer insulating film 16 by the sputtering method for example. Further, a Ta film 101a, a PtMn film 102a, a CoFeB film 103a, an Mg oxide film 104a, a CoFeB film 105a, and a stacked film 106a of a Ru film and a Ta film are formed sequentially over the Pt film 203a by the sputtering method for example.

Then, by performing heat treatment at about 300 C to 350 C in a magnetic field of about 1 T, the directions of magnetization of the CoFeB film 103a and the CoFeB film 105a are made in parallel to each other.

Thereafter, as illustrated in FIG. 8B, patterning by the photolithography technique and the dry etching technique is performed on the stacked film 106a, the CoFeB film 105a, the Mg oxide film 104a, the CoFeB film 103a, the PtMn film 102a, the Ta film 101a, the Pt film 203a, the Ni oxide film 202a, and the stacked film 201a, thereby forming the top electrode 106, the free magnetic layer 105, the tunnel oxide film 104, the fixed magnetic layer 103, the antiferromagnetic layer 102, the bottom electrode 101, the top electrode 203, the resistance variable film 202, and the bottom electrode 201.

Subsequently, as illustrated in FIG. 8C, the silicon nitride film 18 is formed over the interlayer insulating film 16. The fixed magnetic layer 103 and the free magnetic layer 105 contain Fe and hence are liable to oxidize by the influence of moisture or the like when an interlayer insulating film and so on are formed thereafter. The silicon nitride film 18 is formed mainly for protecting the fixed magnetic layer 103 and the free magnetic layer 105 from moisture and the like and suppressing their oxidation.

Figure 8D:
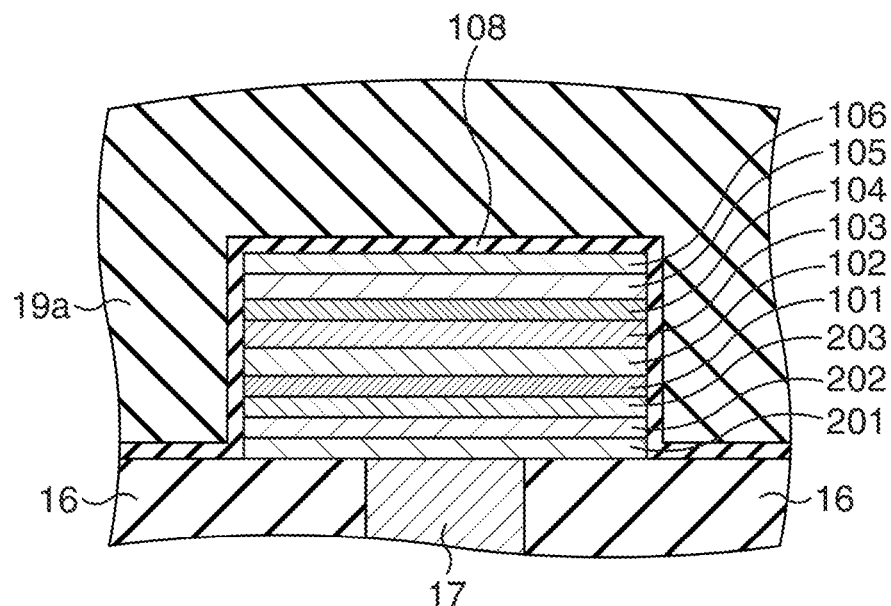

Next, as illustrated in FIG. 8D, a silicon oxide film 19a is formed over the silicon nitride film 18 by the CVD method for example.

Figure 8E:
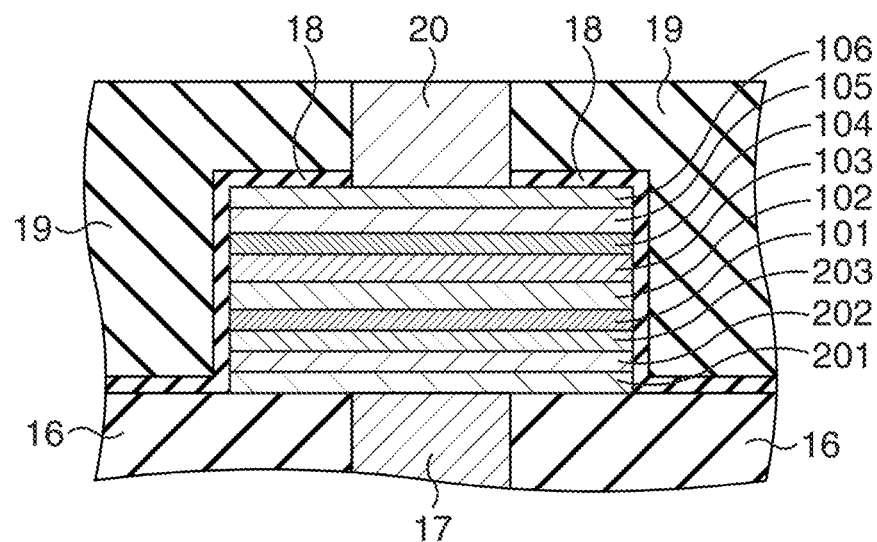

Thereafter, as illustrated in FIG. 8E, the surface of the silicon oxide film 19a is smoothed by the CMP method or the like for example, thereby forming the interlayer insulating film 19. Then, a contact hole is formed in the interlayer insulating film 19 and the silicon nitride film 18, and the plug 20 is formed in the contact hole.

Thus, the magneto-resistance variable element 1 and the resistance variable element 2 can be formed.

Second Embodiment

Figure 9:
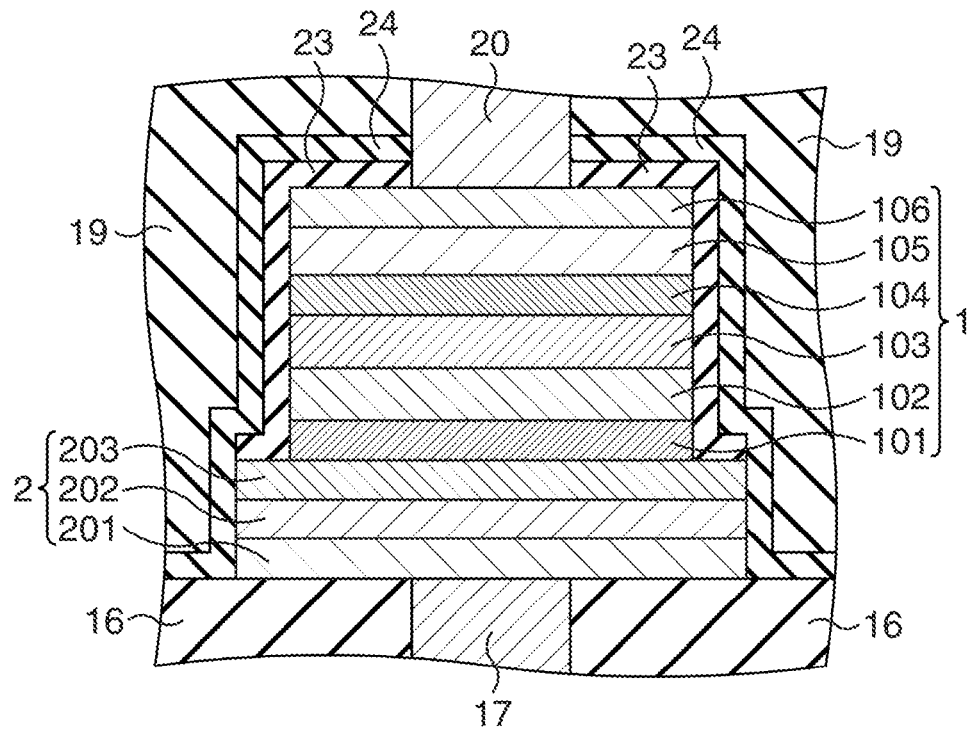
FIG. 9 is a cross-sectional view illustrating structures of the magneto-resistance variable element 1 and the resistance variable element 2 in a second embodiment.

Next, a second embodiment will be described. In the second embodiment, the structures of the magneto-resistance variable element 1 and the resistance variable element 2 are different from those of the first embodiment. FIG. 9 is a cross-sectional view illustrating the structures of the magneto-resistance variable element 1 and the resistance variable element 2 in the second embodiment.

As illustrated in FIG. 9, in the second embodiment, the resistance variable element 2 is formed wider than the magneto-resistance variable element 1 as compared to the first embodiment. That is, what is called a tiered structure is employed. Further, silicon nitride films 23 and 24 are formed as protective films instead of the silicon nitride film 18. The silicon nitride film 23 covers the magneto-resistance variable element 1 and covers only an upper face of the resistance variable element 2. The silicon nitride film 24 covers the magneto-resistance variable element 1 and the resistance variable element 2, on the outside of the silicon nitride film 23. The other structure is the same as that of the first embodiment.

Here, a method for forming the magneto-resistance variable element 1 and the resistance variable element 2 in the second embodiment will be described. FIG. 10A to FIG. 10D are cross-sectional views illustrating the method for forming the magneto-resistance variable element 1 and the resistance variable element 2 in the second embodiment in the order of processes.

First, similarly to the first embodiment, a stacked film 201a, a Ni oxide film 202a, a Pt film 203a, a Ta film 101a, a PtMn film 102a, a CoFeB film 103a, an Mg oxide film 104a, a CoFeB film 105a, and a stacked film 106a are formed sequentially (FIG. 8A).

Then, similarly to the first embodiment, by performing heat treatment at about 300 C to 350 C in a magnetic field of about 1 T, the directions of magnetization of the CoFeB film 103a and the CoFeB film 105a are made in parallel to each other.

Figure 10A:
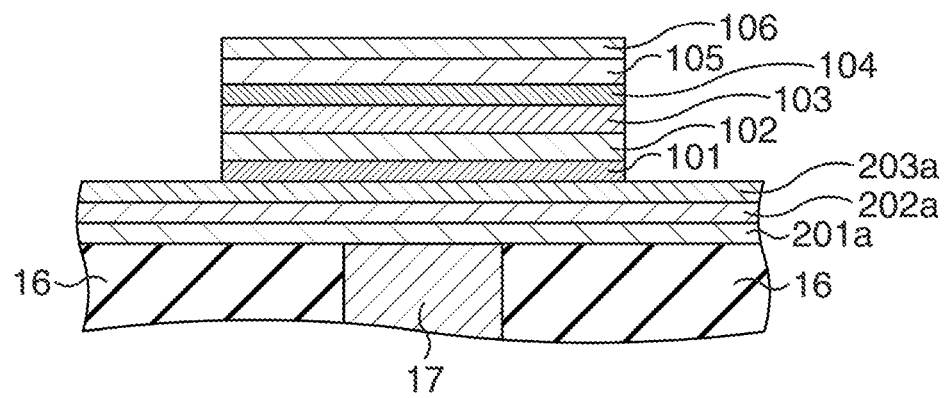
FIGS. 10A to 10D are cross-sectional views illustrating a method for forming the magneto-resistance variable element 1 and the resistance variable element 2 in the second embodiment in the order of processes.
Figure 10B:
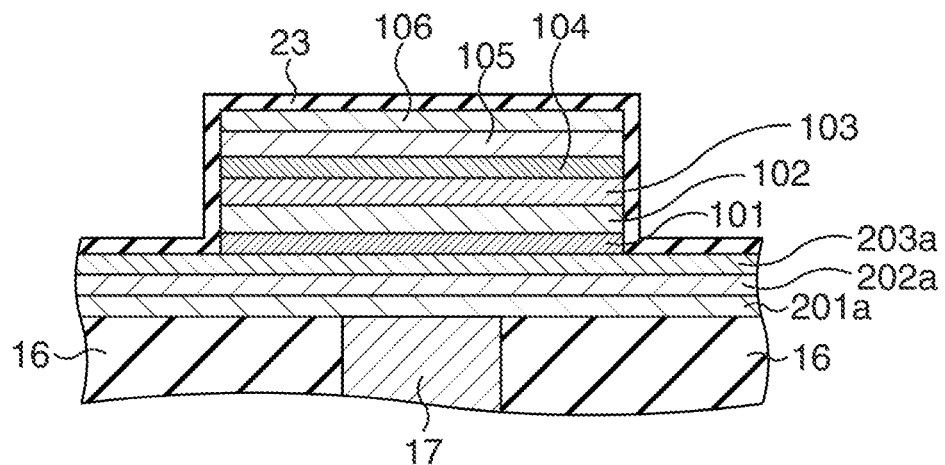

Thereafter, as illustrated in FIG. 10B, patterning by the photolithography technique and the dry etching technique is performed on the stacked film 106a, the CoFeB film 105a, the Mg oxide film 104a, the CoFeB film 103a, the PtMn film 102a, and the Ta film 101a, thereby forming the top electrode 106, the free magnetic layer 105, the tunnel oxide film 104, the fixed magnetic layer 103, the antiferromagnetic layer 102, and the bottom electrode 101.

Subsequently, as illustrated in FIG. 10B, the silicon nitride film 23 is formed over the Pt film 203a. The thickness of the silicon nitride film 23 is about 20 nm to 50 nm for example.

Figure 10C:
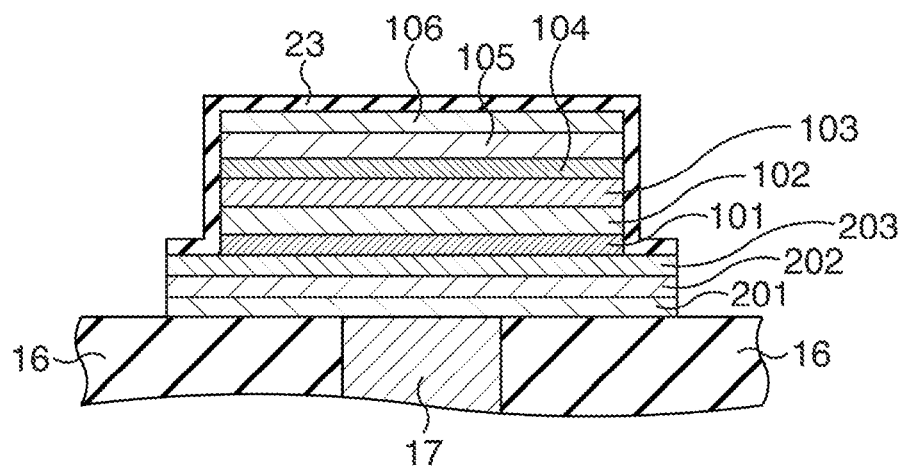

Then, as illustrated in FIG. 10C, patterning by the photolithography technique and the dry etching technique is performed on the silicon nitride film 23, the Pt film 203a, the Ni oxide film 202a, and the stacked film 201a, thereby forming the top electrode 203, the resistance variable film 202, and the bottom electrode 201.

Figure 10D:
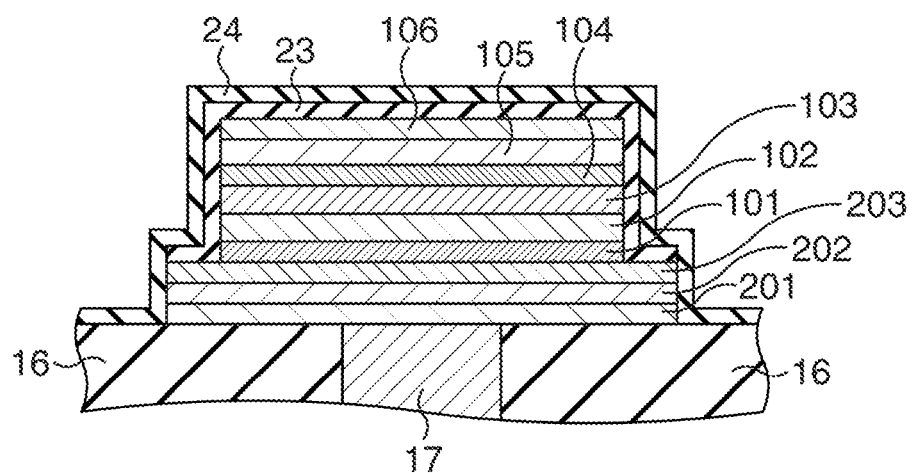

Thereafter, as illustrated in FIG. 10D, the silicon nitride film 24 is formed over the interlayer insulating film 16. The thickness of the silicon nitride film 24 is about 20 nm to 50 nm for example. Then, processing similar to that in the first embodiment is performed.

Thus, the magneto-resistance variable element 1 and the resistance variable element 2 can be formed.

In the second embodiment as described above, etching for forming the magneto-resistance variable element 1 and etching for forming the resistance variable element 2 are performed separately, and thus appropriate processing can be performed more easily than in the first embodiment. That is, the number of layers to be subjected to each etching is small, and thus it is possible to perform etching easily under more appropriate conditions. However, in view of the processing time and the number of processes, it can be said that the first embodiment is preferable to the second embodiment.

Third Embodiment

Figure 11:
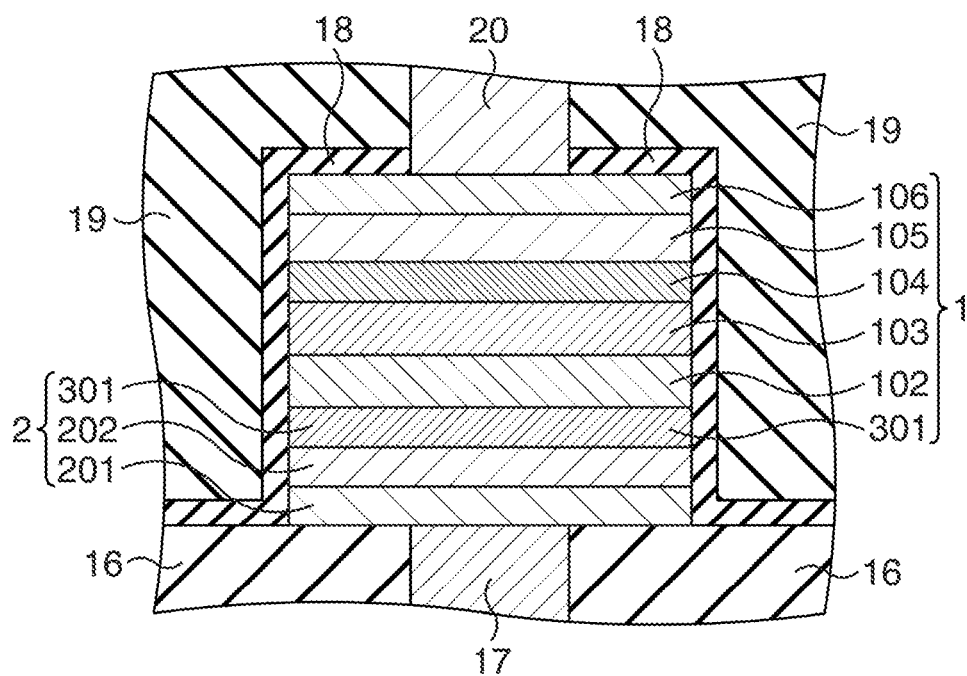
FIG. 11 is a cross-sectional view illustrating structures of the magneto-resistance variable element 1 and the resistance variable element 2 in a third embodiment.

Next, a third embodiment will be described. In the third embodiment, the structures of the magneto-resistance variable element 1 and the resistance variable element 2 are different from those of the first embodiment. FIG. 11 is a cross-sectional view illustrating the structures of the magneto-resistance variable element 1 and the resistance variable element 2 in the third embodiment.

As illustrated in FIG. 11, in the third embodiment, an intermediate electrode 301 is provided instead of the top electrode 203 of the resistance variable element 2 and the bottom electrode 101 of the magneto-resistance variable element 1 in the first embodiment. As the intermediate electrode 301, for example, a Pt film with a thickness of about 5 nm to 10 nm (for example, 5 nm) is used. Then, the intermediate electrode 301 functions as the top electrode of the resistance variable element 2 and the bottom electrode of the magneto-resistance variable element 1. The other structure is the same as that of the first embodiment.

Here, a method for forming the magneto-resistance variable element 1 and the resistance variable element 2 in the third embodiment will be described. FIG. 12A to FIG. 12D are cross-sectional views illustrating the method for forming the magneto-resistance variable element 1 and the resistance variable element 2 in the third embodiment in the order of processes.

Figure 12A:
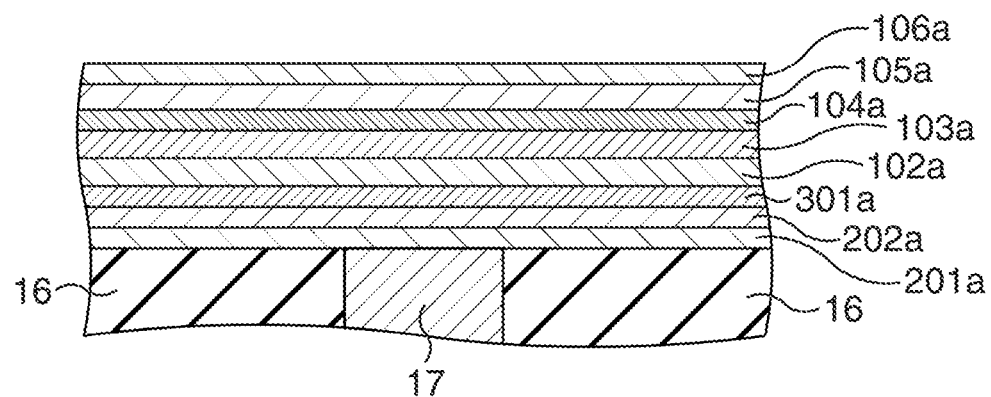
FIGS. 12A to 12D are cross-sectional views illustrating a method for forming the magneto-resistance variable element 1 and the resistance variable element 2 in the third embodiment in the order of processes.

First, as illustrated in FIG. 12A, the stacked film 201a, the Ni oxide film 202a, a Pt film 301a, the PtMn film 102a, the CoFeB film 103a, the Mg oxide film 104a, the CoFeB film 105a, and the stacked film 106a are formed sequentially over the interlayer insulating film 16 by the sputtering method for example.

Then, by performing heat treatment at about 300 C to 350 C in a magnetic field of about 1 T, the directions of magnetization of the CoFeB film 103a and the CoFeB film 105a are made in parallel to each other.

Figure 12B:
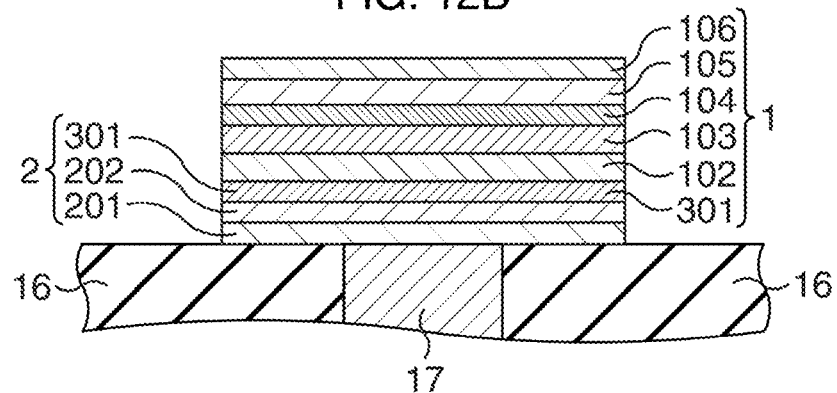

Thereafter, as illustrated in FIG. 12B, patterning by the photolithography technique and the dry etching technique is performed on the stacked film 106a, the CoFeB film 105a, the Mg oxide film 104a, the CoFeB film 103a, the PtMn film 102a, the Pt film 301, the Ni oxide film 202a, and the stacked film 201a, thereby forming the top electrode 106, the free magnetic layer 105, the tunnel oxide film 104, the fixed magnetic layer 103, the antiferromagnetic layer 102, the intermediate electrode 301, the resistance variable film 202, and the bottom electrode 201.

Figure 12C:
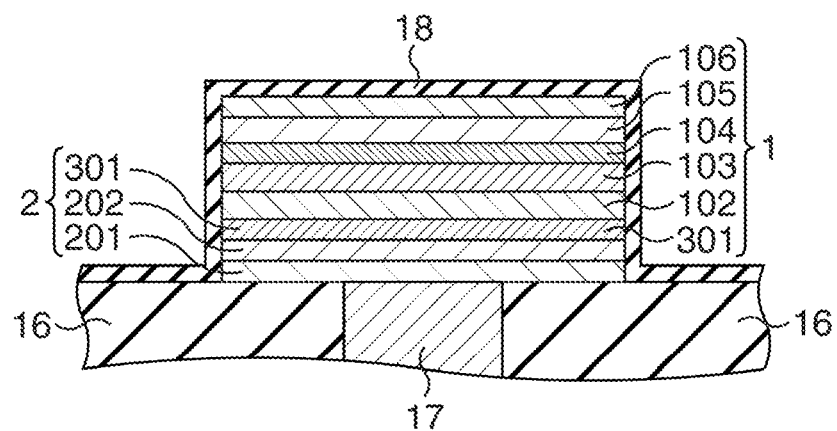

Subsequently, as illustrated in FIG. 12C, the silicon nitride film 18 is formed over the interlayer insulating film 16.

Figure 12D:
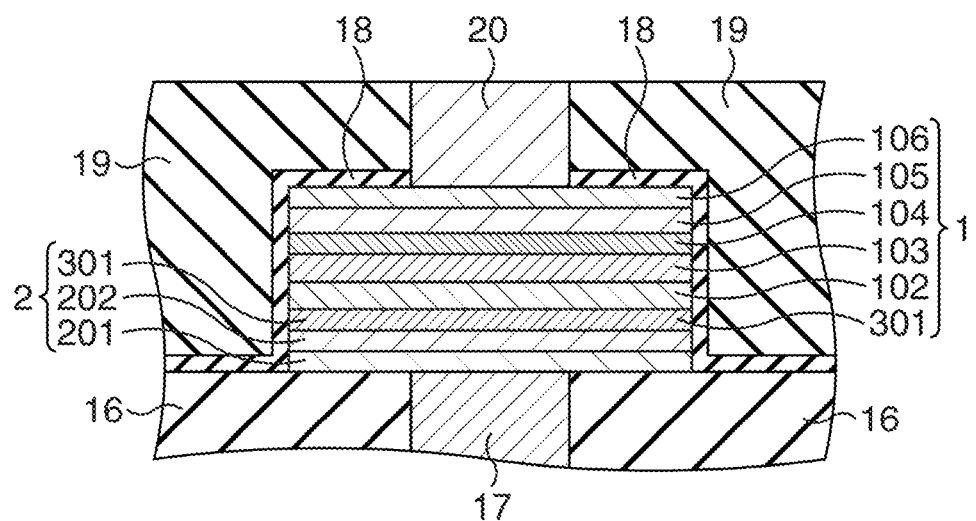

Then, as illustrated in FIG. 12D, the interlayer insulating film 19 is formed over the silicon nitride film 18. As described above, as the interlayer insulating film 19, a silicon oxide film is formed by the CVD method for example. Thereafter, the surface of the interlayer insulating film 19 is smoothed by the CMP method or the like for example, the contact hole is formed in the interlayer insulating film 19 and the silicon nitride film 18, and the plug 20 is formed in the contact hole.

Thus, the magneto-resistance variable element 1 and the resistance variable element 2 can be formed.

In the third embodiment as described above, one intermediate electrode 301 functions as the top electrode 203 and the bottom electrode 101. Thus, as compared to the first embodiment, dimensions in the thickness direction can be made small. Further, during manufacturing, since the number of layers to be formed becomes small, the processing time and the number of processes can be decreased.

Fourth Embodiment

Figure 13:
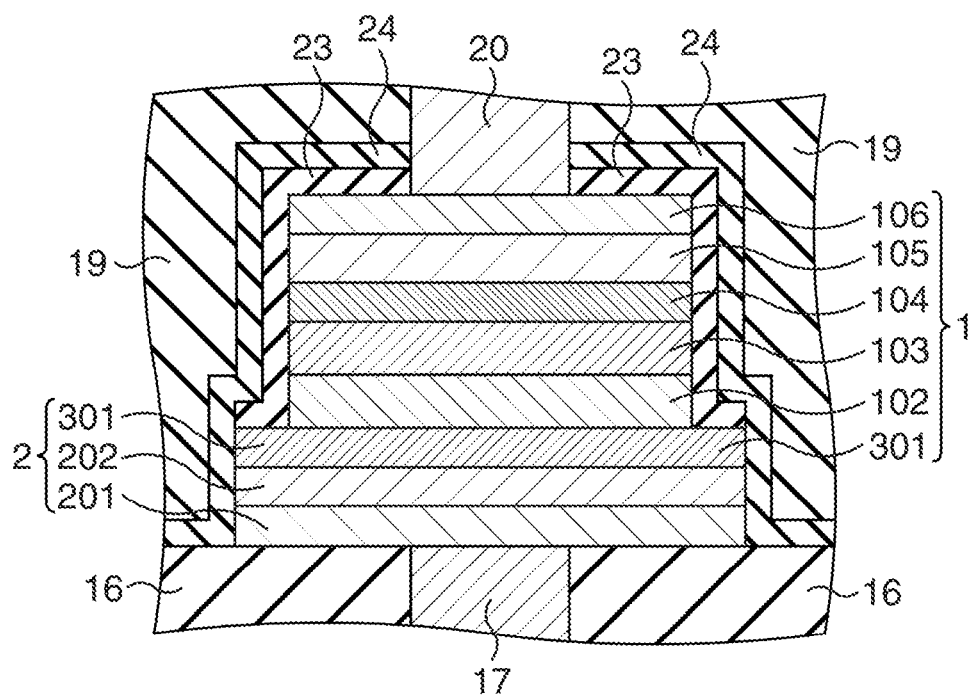
FIG. 13 is a cross-sectional view illustrating structures of the magneto-resistance variable element 1 and the resistance variable element 2 in a fourth embodiment.

Next, a fourth embodiment will be described. In the fourth embodiment, the structures of the magneto-resistance variable element 1 and the resistance variable element 2 are different from those of the first embodiment. FIG. 13 is a cross-sectional view illustrating the structures of the magneto-resistance variable element 1 and the resistance variable element 2 in the fourth embodiment.

As illustrated in FIG. 13, in the fourth embodiment, the intermediate electrode 301, the resistance variable film 202, and the bottom electrode 201 are formed wide as compared to the third embodiment. That is, what is called a tiered structure is employed. Further, silicon nitride films 23 and 24 are formed as protective films instead of the silicon nitride film 18. The intermediate electrode 301 functions as the top electrode of the resistance variable element 2 and the bottom electrode of the magneto-resistance variable element 1, similarly to the third embodiment. The other structure is the same as that of the third embodiment.

Here, a method for forming the magneto-resistance variable element 1 and the resistance variable element 2 in the fourth embodiment will be described. FIG. 14A to FIG. 14D are cross-sectional views illustrating the method for forming the magneto-resistance variable element 1 and the resistance variable element 2 in the fourth embodiment in the order of processes.

First, similarly to the third embodiment, the stacked film 201a, the Ni oxide film 202a, the Pt film 301a, the PtMn film 102a, the CoFeB film 103a, the Mg oxide film 104a, the CoFeB film 105a, and the stacked film 106a are formed sequentially (FIG. 12A).

Then, similarly to the first embodiment, by performing heat treatment at about 300 C to 350 C in a magnetic field of about 1 T, the directions of magnetization of the CoFeB film 103a and the CoFeB film 105a are made in parallel to each other.

Figure 14A:
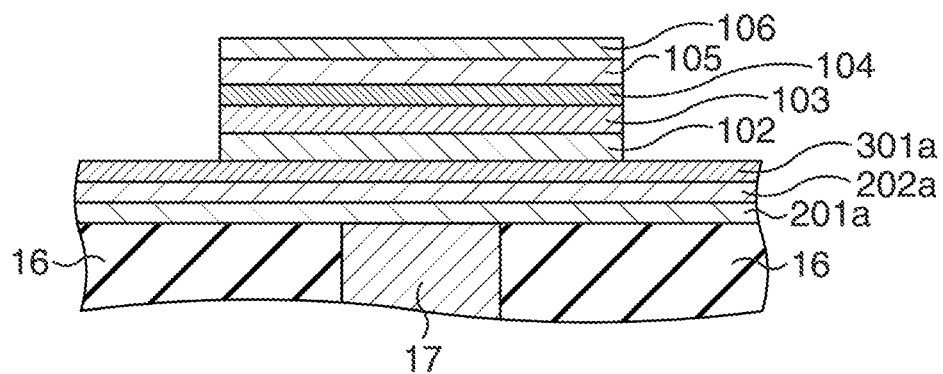
FIGS. 14A to 14D are cross-sectional views illustrating a method for forming the magneto-resistance variable element 1 and the resistance variable element 2 in the fourth embodiment in the order of processes.

Thereafter, as illustrated in FIG. 14A, patterning by the photolithography technique and the dry etching technique is performed on the stacked film 106a, the CoFeB film 105a, the Mg oxide film 104a, the CoFeB film 103a, and the PtMn film 102a, thereby forming the top electrode 106, the free magnetic layer 105, the tunnel oxide film 104, the fixed magnetic layer 103, and the antiferromagnetic layer 102.

Figure 14B:
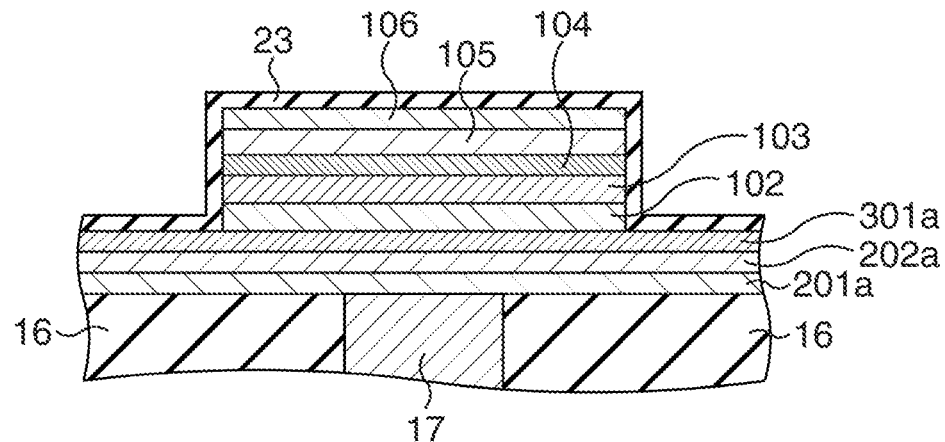

Subsequently, as illustrated in FIG. 14B, the silicon nitride film 23 is formed over the Pt film 301a.

Figure 14C:
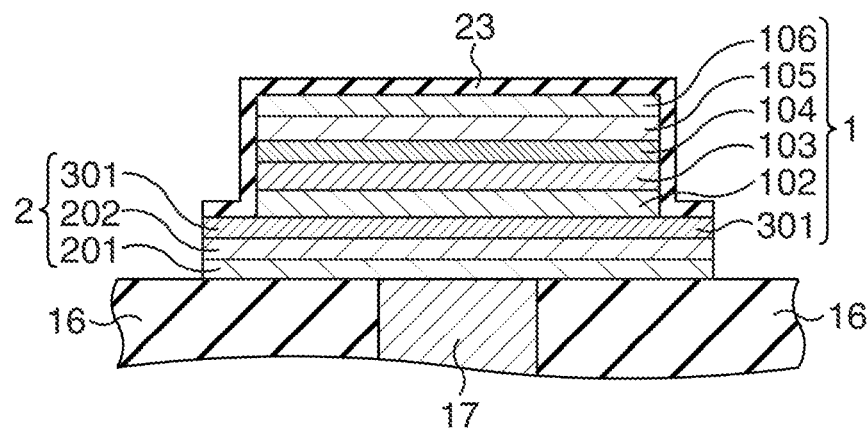

Then, as illustrated in FIG. 14C, patterning by the photolithography technique and the dry etching technique is performed on the silicon nitride film 23, the Pt film 301a, the Ni oxide film 202a, and the stacked film 201a, thereby forming the intermediate electrode 301, the resistance variable film 202, and the bottom electrode 201.

Figure 14D:
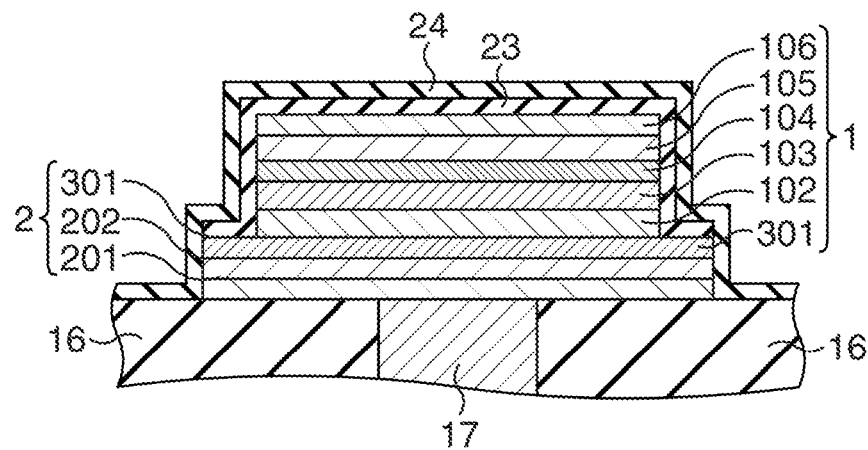

Thereafter, as illustrated in FIG. 14D, the silicon nitride film 24 is formed over the interlayer insulating film 16. Then processing similar to that in the first embodiment is performed.

Thus, the magneto-resistance variable element 1 and the resistance variable element 2 are formed.

Fifth Embodiment

Figure 15A:
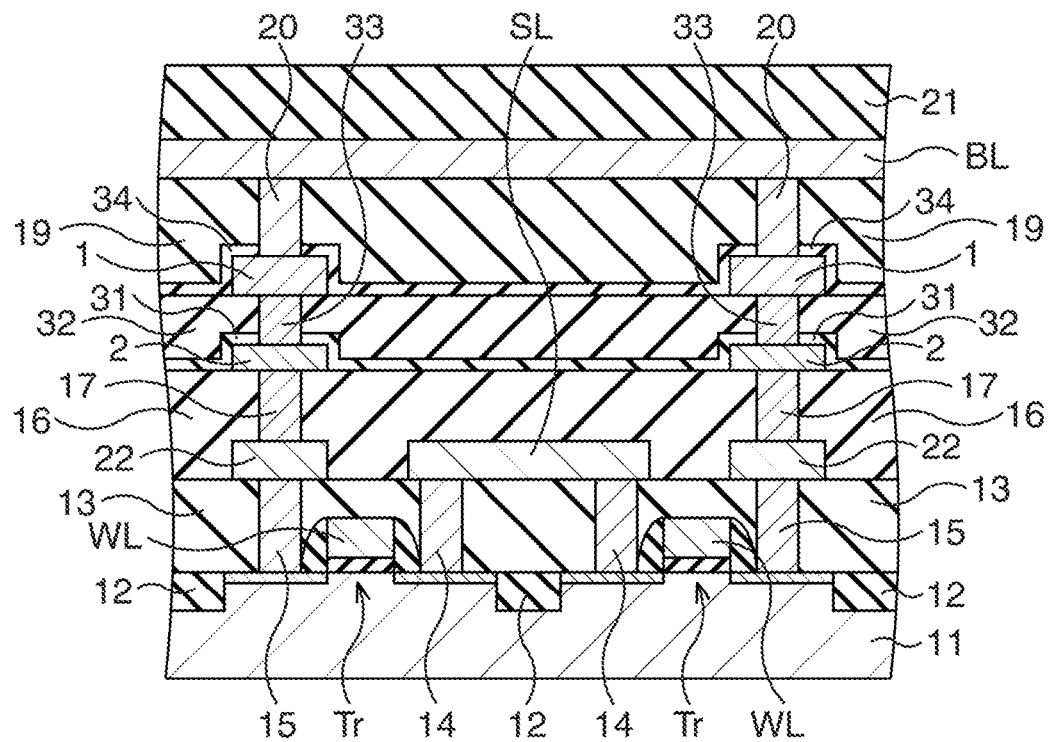
FIG. 15A is a cross-sectional view taken along the line I-I of FIG. 2 in a fifth embodiment.
Figure 15B:
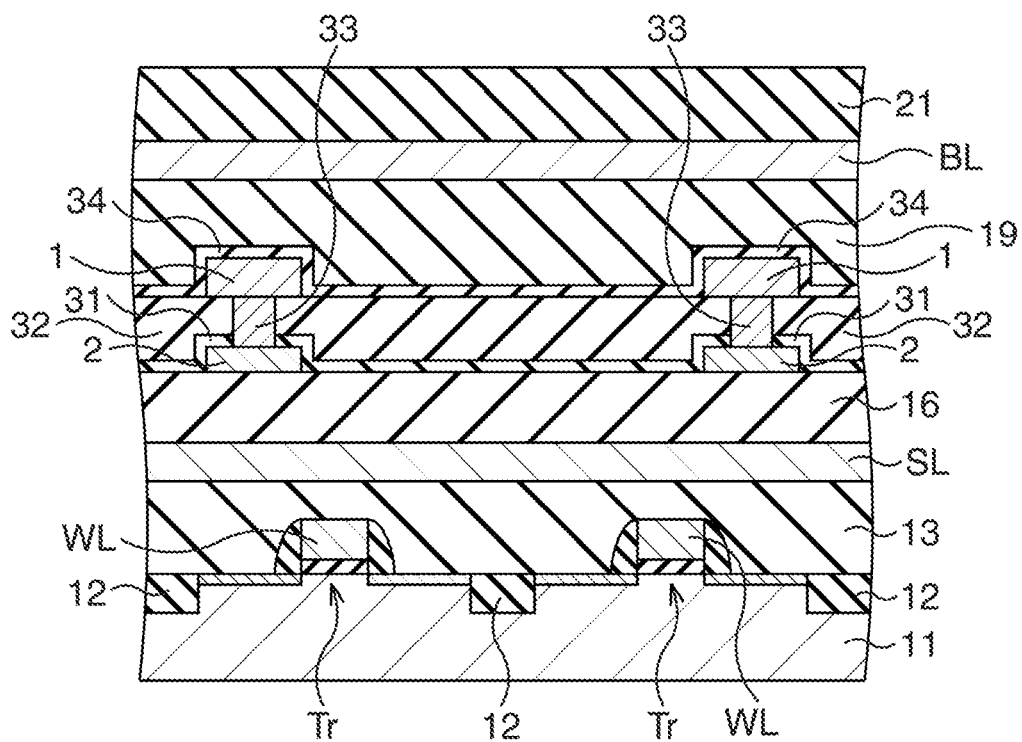
FIG. 15B is a cross-sectional view taken along the line II-II of FIG. 2 in the fifth embodiment.

Next, a fifth embodiment will be described. In the fifth embodiment, the structures of the magneto-resistance variable element 1 and the resistance variable element 2 are different from those of the first embodiment. FIG. 15A is a cross-sectional view taken along the line I-I of FIG. 2 in the fifth embodiment. FIG. 15B is a cross-sectional view taken along the line II-II of FIG. 2 in the fifth embodiment. Here, one memory cell will be described.

In the fifth embodiment, as illustrated in FIG. 15A and FIG. 15B, on the interlayer insulating film 16, the resistance variable element 2 is formed with the bottom electrode 201 connected to the plug 17. A silicon nitride film 31 covering the resistance variable element 2 is formed as a protective film over the interlayer insulating film 16. The thickness of the silicon nitride film 31 is about 20 nm to 50 nm for example. An interlayer insulating film 32 is formed over the silicon nitride film 31. A plug 33 connected to the top electrode 203 of the resistance variable element 2 is formed in the silicon nitride film 31 and the interlayer insulating film 32.

Further, the magneto-resistance variable element 1 is formed with the bottom electrode 101 connected to the plug 33 on the interlayer insulating film 32. A silicon nitride film 34 covering the magneto-resistance variable element 1 is formed as a protective film over the interlayer insulating film 32. The thickness of the silicon nitride film 34 is about 20 nm to 50 nm for example. The interlayer insulating film 19 is formed over the silicon nitride film 34. The plug 20 connected to the top electrode 106 of the magneto-resistance variable element 1 is formed in the silicon nitride film 34 and the interlayer insulating film 19. The bit line BL connected to the plug 20 is formed on the interlayer insulating film 19. Further, the interlayer insulating film 21 covering the bit line BL is formed over the interlayer insulating film 19. Other wirings, a passivation film, and so on are formed above the interlayer insulating film 21.

The other structure is the same as that of the first embodiment.

By the fifth embodiment structured as described above, effects similar to those of the first embodiment can be obtained.

Figure 16A:
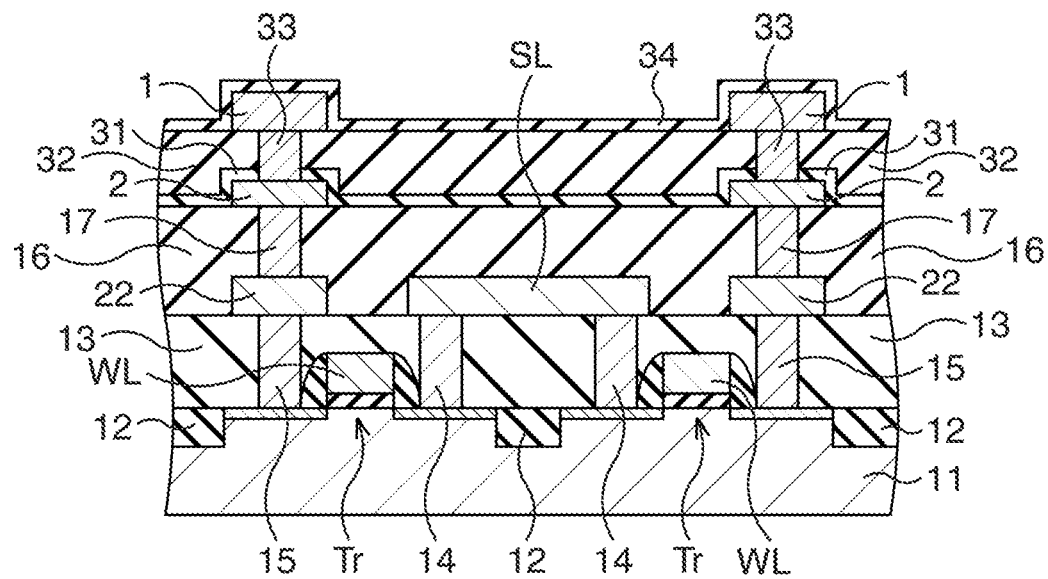
FIGS. 16A to 16B are cross-sectional views illustrating a method for manufacturing a semiconductor memory device according to the fifth embodiment in the order of processes.
Figure 16B:
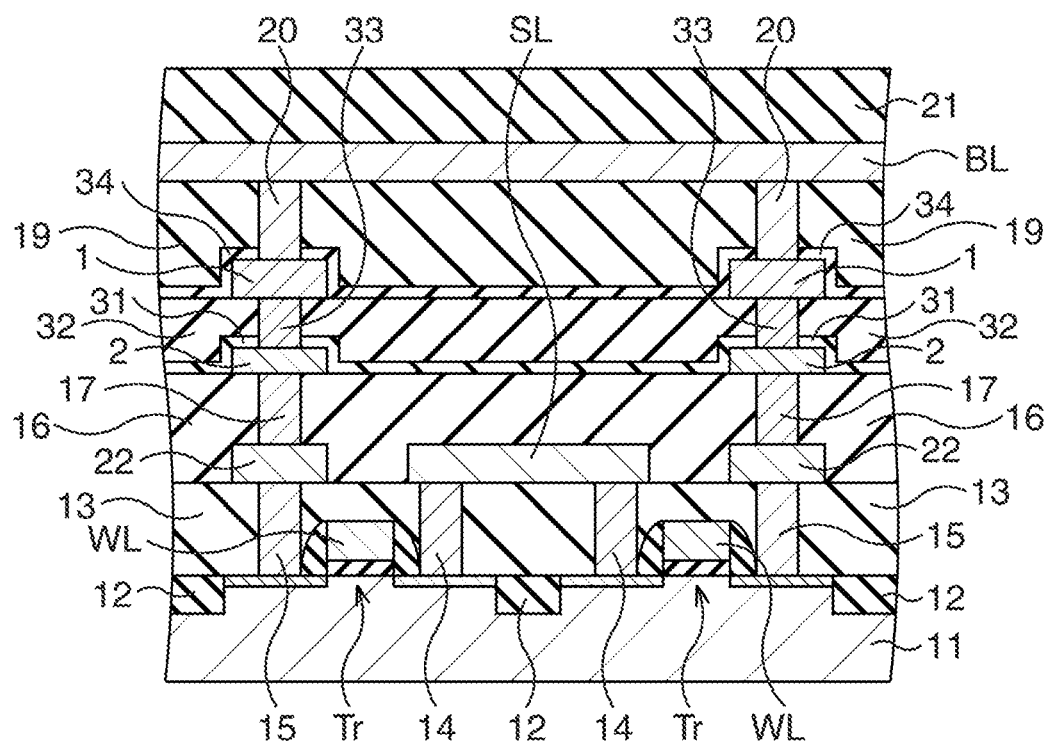

Next, a method for manufacturing a semiconductor memory device according to the fifth embodiment will be described. FIG. 16A and FIG. 16B are cross-sectional views illustrating the method for manufacturing the semiconductor memory device according to the fifth embodiment. The cross-sections illustrated in FIG. 16A and FIG. 16B correspond to the cross section along the line I-I of FIG. 2.

First, similarly to the first embodiment, processing up to formation of the plug 17 is performed (FIG. 7C). Next, as illustrated in FIG. 16A, the resistance variable element 2 is formed on the interlayer insulating film 16. A method for forming the resistance variable element 2 will be described later. Thereafter, the silicon nitride film 31 as a protective film is formed over the interlayer insulating film 16. The silicon nitride film 31 is formed by the sputtering method or the CVD method for example.

Subsequently, the interlayer insulating film 32 is formed over the silicon nitride film 31. As the interlayer insulating film 32, a silicon oxide film is formed by the CVD method for example. Then, a contact hole is formed in the interlayer insulating film 32 and the silicon nitride film 31 by the photolithography technique and the dry etching technique, and the plug 33 is formed in the contact hole. In formation of the plug 33, for example, a Ti nitride film as a barrier metal film and a tungsten film are formed by the sputtering method or the CVD method, and these films are polished by the chemical mechanical polishing (CMP) method, for example, until the surface of the interlayer insulating film 32 is exposed. It should be noted that the damascene method as described above may be employed.

Thereafter, the magneto-resistance variable element 1 is formed on the interlayer insulating film 32. A method for forming the magneto-resistance variable element 1 will be described later. Subsequently, the silicon nitride film 34 as a protective film is formed over the interlayer insulating film 32. The silicon nitride film 34 is formed by the sputtering method or the CVD method for example. Then, as illustrated in FIG. 16B, the interlayer insulating film 19 is formed over the silicon nitride film 34. Thereafter, a contact hole is formed in the interlayer insulating film 19 and the silicon nitride film 34 by the photolithography technique and the dry etching technique, and the plug 20 is formed in the contact hole.

Further, the bit line BL is formed on the interlayer insulating film 19. Then, the interlayer insulating film 21 is formed over the interlayer insulating film 19. Thereafter, other wirings, a passivation film, and so on are formed above the interlayer insulating film 21, thereby completing the semiconductor memory device.

Here, a method for forming the magneto-resistance variable element 1 and the resistance variable element 2 in the fifth embodiment will be described. FIG. 17A to FIG. 17H are cross-sectional views illustrating the method for forming the magneto-resistance variable element 1 and the resistance variable element 2 in the fifth embodiment in the order of processes.

Figure 17A:
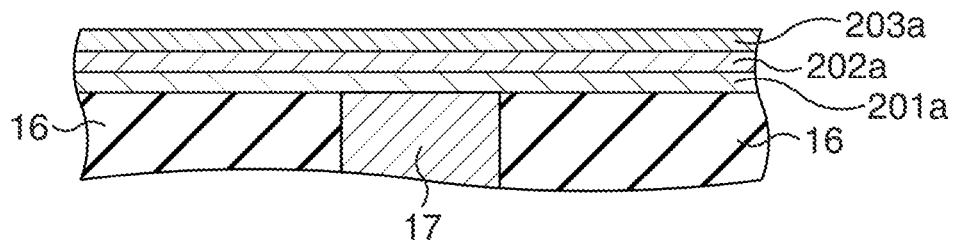
FIGS. 17A to 17H are cross-sectional views illustrating a method for forming the magneto-resistance variable element 1 and the resistance variable element 2 in the fifth embodiment in the order of processes.

First, as illustrated in FIG. 17A, a stacked film 201a of a Ti nitride film and a Ni film, a Ni oxide film 202a, and a Pt film 203a are formed sequentially over the interlayer insulating film 16 by the sputtering method for example.

Figure 17B:
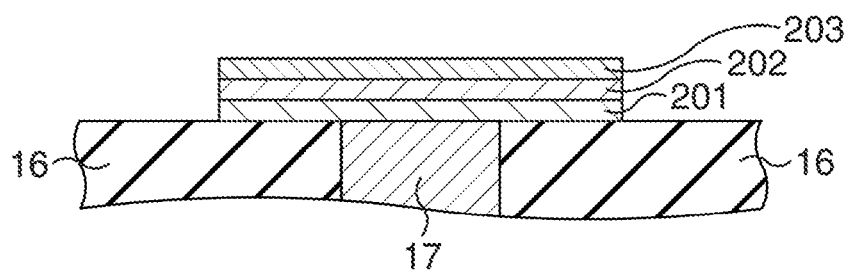

Then, as illustrated in FIG. 17B, patterning by the photolithography technique and the dry etching technique is performed on the Pt film 203a, the Ni oxide film 202a, and the stacked film 201a, thereby forming the top electrode 203, the resistance variable film 202, and the bottom electrode 201.

Figure 17C:
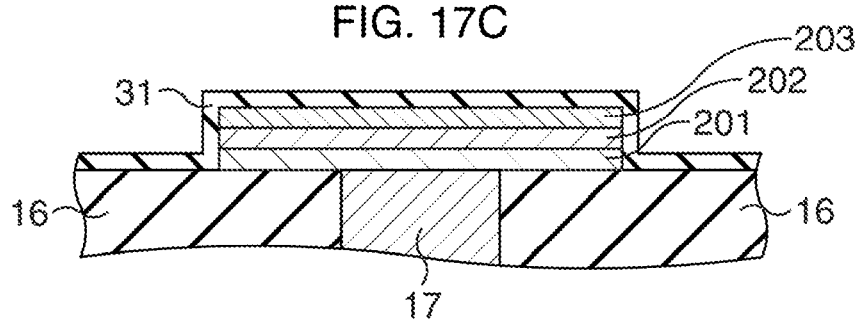

Thereafter, as illustrated in FIG. 17C, the silicon nitride film 31 is formed over the interlayer insulating film 16.

Figure 17D:
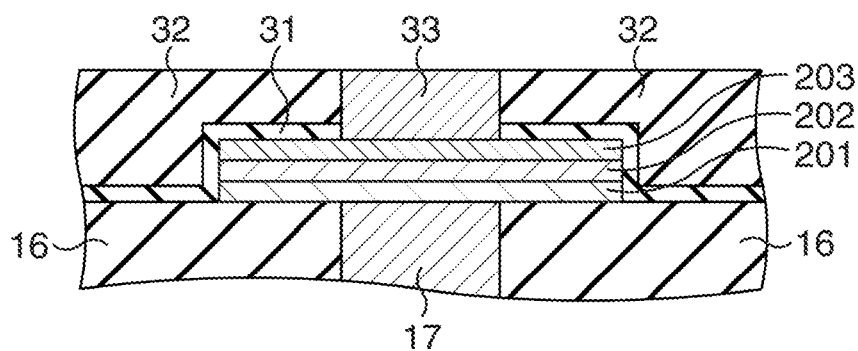

Subsequently, as illustrated in FIG. 17D, the interlayer insulating film 32 is formed over the silicon nitride film 31. As described above, as the interlayer insulating film 32, a silicon oxide film is formed by the CVD method for example. Then, a contact hole is formed in the interlayer insulating film 32 and the silicon nitride film 31, and the plug 33 is formed in the contact hole.

Figure 17E:
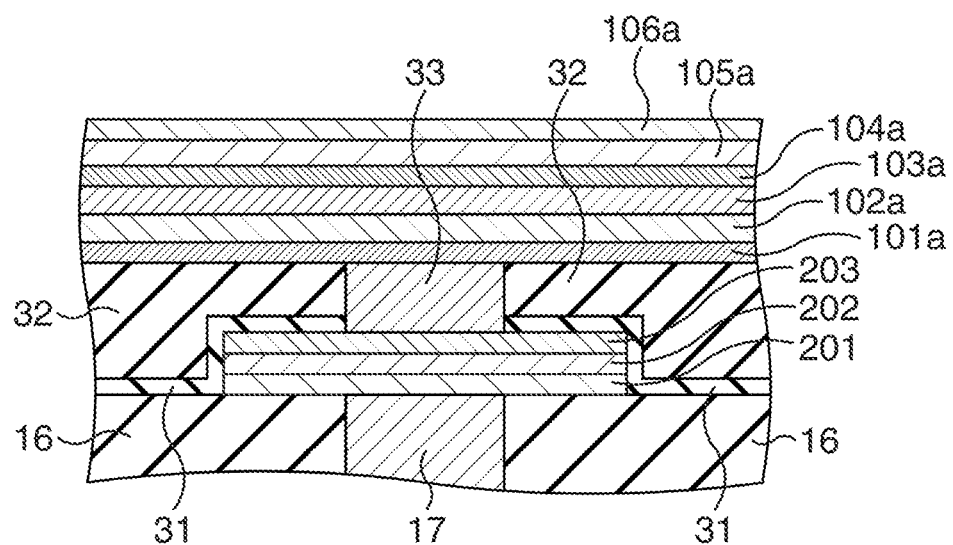

Thereafter, as illustrated in FIG. 17E, a Ta film 101a, a PtMn film 102a, a CoFeB film 103a, an Mg oxide film 104a, a CoFeB film 105a, and a stacked film 106a of a Ru film and a Ta film are formed sequentially over the interlayer insulating film 32 by the sputtering method for example.

Subsequently, by performing heat treatment at about 300 C to 350 C in a magnetic field of about 1 T, the directions of magnetization of the CoFeB film 103a and the CoFeB film 105a are made in parallel to each other.

Figure 17F:
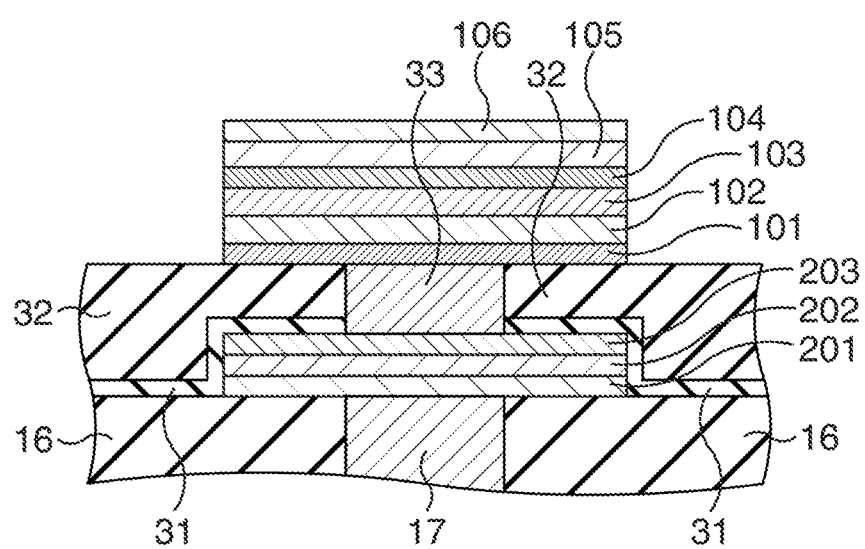

Then, as illustrated in FIG. 17F, patterning by the photolithography technique and the dry etching technique is performed on the stacked film 106a, the CoFeB film 105a, the Mg oxide film 104a, the CoFeB film 103a, the PtMn film 102a, and the Ta film 101a, thereby forming the top electrode 106, the free magnetic layer 105, the tunnel oxide film 104, the fixed magnetic layer 103, the antiferromagnetic layer 102, and the bottom electrode 101.

Figure 17G:
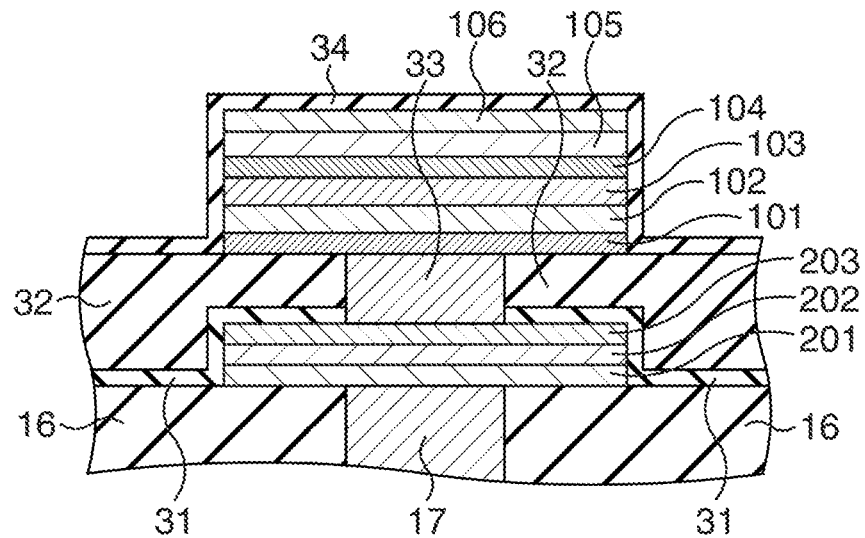

Thereafter, as illustrated in FIG. 17G, the silicon nitride film 34 is formed over the interlayer insulating film 32.

Figure 17H:
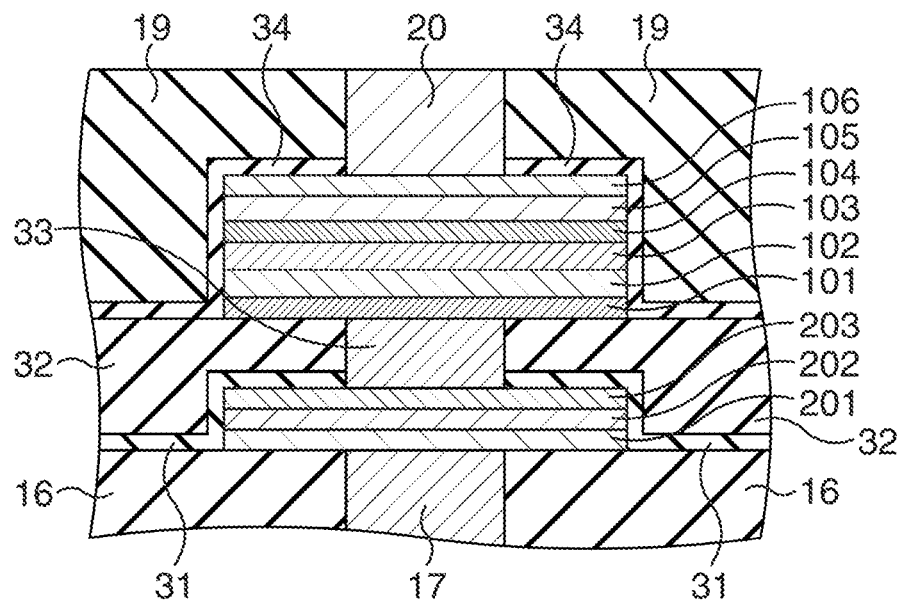

Subsequently, as illustrated in FIG. 17H, the interlayer insulating film 19 is formed over the silicon nitride film 34. Then, a contact hole is formed in the interlayer insulating film 19 and the silicon nitride film 34, and the plug 20 is formed in the contact hole.

Thus, the magneto-resistance variable element 1 and the resistance variable element 2 can be formed.

Incidentally, although the resistance variable element 2 is located below the magneto-resistance variable element 1 in the first to fifth embodiments, the resistance variable element 2 may be located above the magneto-resistance variable element 1. That is, the resistance variable element 2 may be connected between the magneto-resistance variable element 1 and the bit line BL.

When the resistance variable element 2 is located above the magneto-resistance variable element 1 in the first embodiment, a Ta film with a thickness of about 5 nm to 50 nm (for example, 5 nm) may be used as the bottom electrode 101 for example. A PtMn film with a thickness of about 10 nm to 30 nm (for example, 15 nm) may be used as the antiferromagnetic layer 102 for example. A CoFeB film with a thickness of about 2 nm to 4 nm (for example, 3 nm) may be used as the fixed magnetic layer 103 for example. An Mg oxide film with a thickness of about 0.5 nm to 2 nm (for example, 1 nm) may be used as the tunnel oxide film 104 for example. A CoFeB film with a thickness of about 1 nm to 3 nm (for example, 2 nm) may be used as the free magnetic layer 105 for example. The top electrode 106 may include, for example, a Ru film with a thickness of about 1 nm to 15 nm (for example, 10 nm) and a Ta film thereon with a thickness of about 2 nm to 50 nm (for example, 20 nm). Further, the bottom electrode 201 may include, for example, a Ti nitride film with a thickness of about 5 nm to 50 nm (for example, 5 nm) and a Ni film thereon with a thickness of about 5 nm to 50 nm (for example, 20 nm).

A Ni oxide film with a thickness of about 2 nm to 20 nm (for example, 5 nm) may be used as the resistance variable film 202 for example. A Pt film with a thickness of about 2 nm to 50 nm (for example, 20 nm) may be used as the top electrode 203 for example.

Further, as in the third embodiment, one intermediate electrode may function as the top electrode of the magneto-resistance variable element 1 and the bottom electrode of the resistance variable element 2. In this case, a stacked film of a Ru film with a thickness of about 5 nm to 20 nm (for example, 10 nm) and a Ta film thereon with a thickness of about 5 nm to 30 nm (for example, 20 nm) may be used as the intermediate electrode for example.

Further, as in the second and fourth embodiments, what is called a tiered structure may be employed.

Moreover, a phase-change resistance variable element of a phase change memory may be provided instead of the resistance variable element 2 in the first to fifth embodiments. The characteristics of the phase-change resistance variable element are not affected by the polarity of voltage and the direction of current.

When the phase-change resistance variable element is provided in the first embodiment, the structure of the magneto-resistance variable element 1 may be similar to that of the first embodiment. A Ti nitride film with a thickness of about 10 nm to 50 nm (for example, 20 nm) may be used as the bottom electrode of the phase-change resistance variable element for example. A GeSbTe film with a thickness of about 50 nm to 100 nm (for example, 50 nm) may be used as the resistance variable film for example, and a Ta film with a thickness of about 20 nm to 50 nm (for example, 20 nm) may be used as the top electrode for example.

Further, as in the third embodiment, one intermediate electrode may function as the top electrode of the magneto-resistance variable element 1 and the bottom electrode of the phase-change resistance variable element. In this case, a stacked film of a Ru film with a thickness of about 1 nm to 15 nm (for example, 10 nm) and a Ta film thereon with a thickness of about 5 nm to 20 nm (for example, 20 nm) may be used as the intermediate electrode for example. Moreover, a titanium nitride film with a thickness of about 10 nm to 50 nm (for example, 20 nm) may be used as the top electrode of the phase-change resistance variable element for example.

Figure 18A:
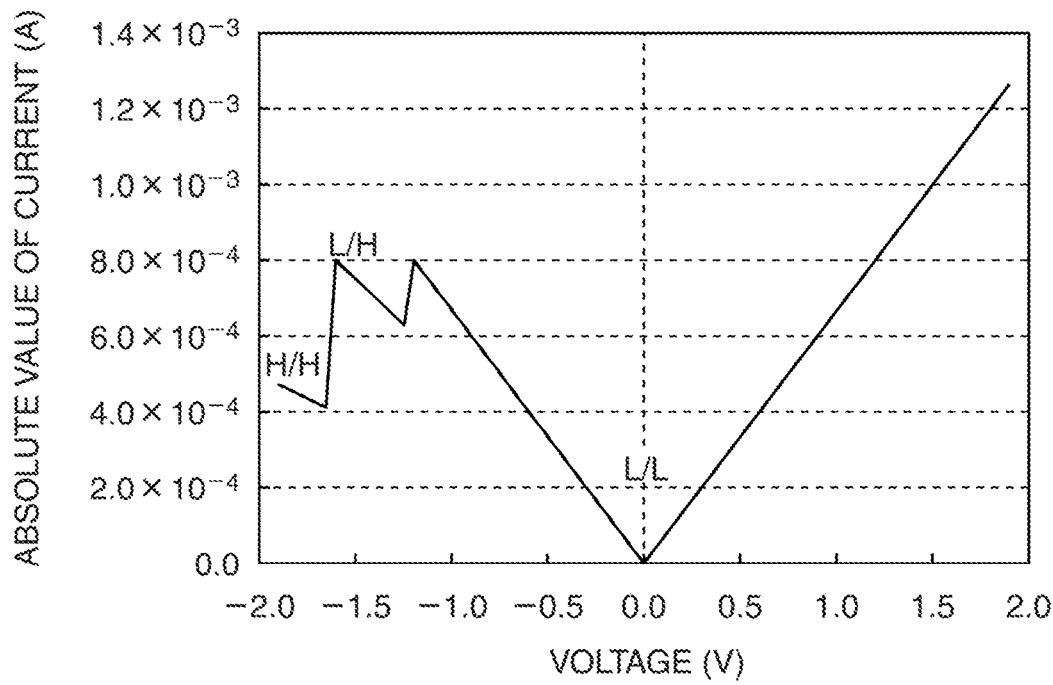
FIG. 18A is a chart illustrating a characteristic when both magneto-resistance variable elements are in a low resistance state (L/L) in an initial state.
Figure 18B:
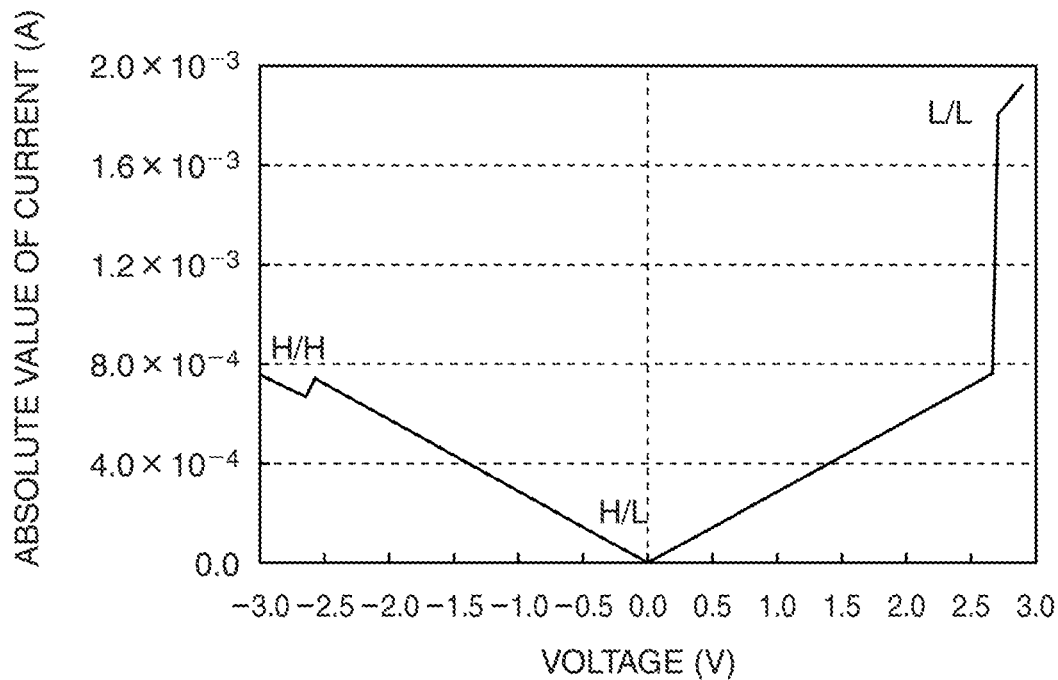
FIG. 18B is a chart illustrating a characteristic when the magneto-resistance variable element on a bit line BL side is in a high resistance state and the magneto-resistance variable element on a transistor Tr side is in the low resistance state (H/L) in the initial state.
Figure 18C:
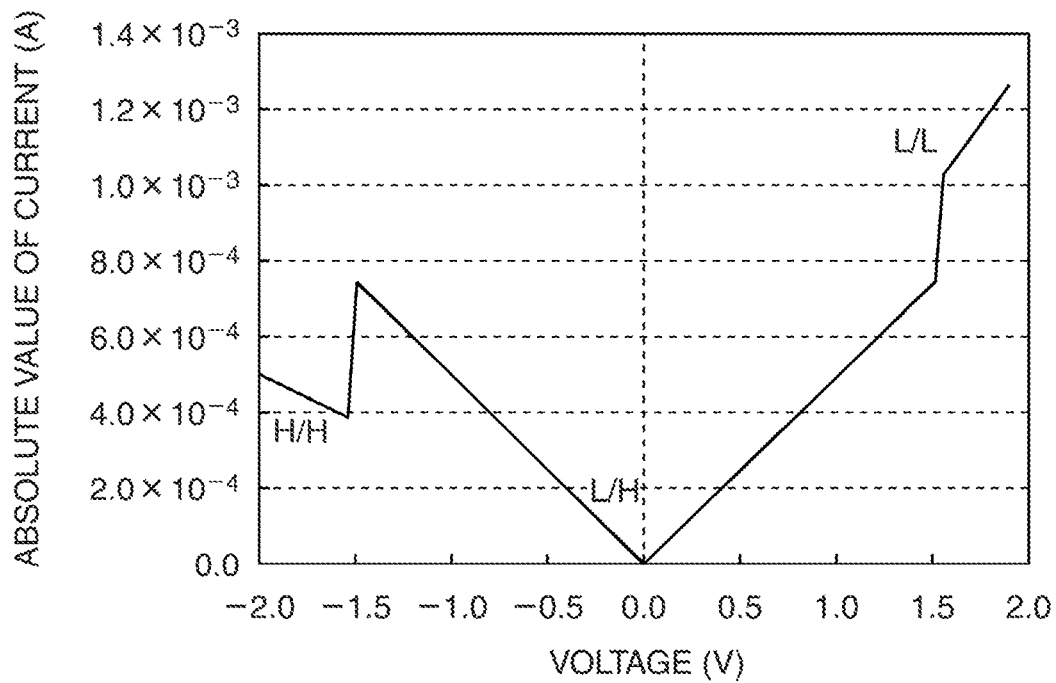
FIG. 18C is a chart illustrating a characteristic when the magneto-resistance variable element on the bit line BL side is in the low resistance state and the magneto-resistance variable element on the transistor Tr side is in the high resistance state (L/H) in the initial state.
Figure 18D:
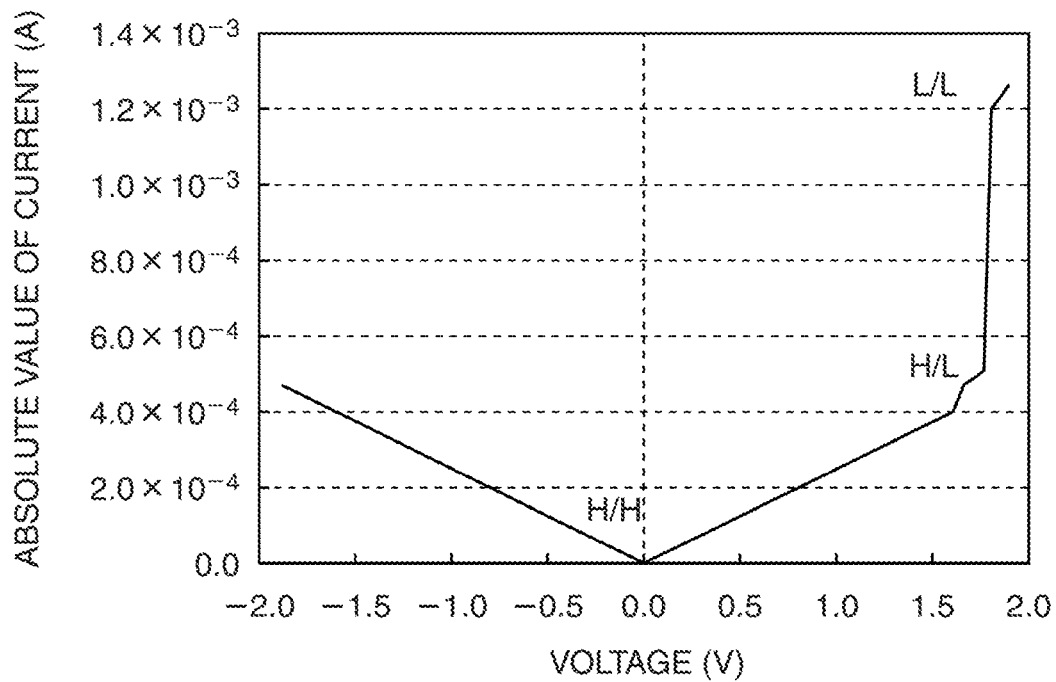
FIG. 18D is a chart illustrating a characteristic when both the magneto-resistance variable elements are in the high resistance state (H/H) in the initial state.

Here, for comparison, control for storing quaternary information by combining two magneto-resistance variable elements will be described. FIG. 18A illustrates a characteristic when both the magneto-resistance variable elements are in a low resistance state (L/L) in an initial state. FIG. 18B illustrates a characteristic when the magneto-resistance variable element on the bit line BL side is in a high resistance state and the magneto-resistance variable element on the transistor Tr side is in the low resistance state (H/L) in the initial state. FIG. 18C illustrates a characteristic when the magneto-resistance variable element on the bit line BL side is in the low resistance state and the magneto-resistance variable element on the transistor Tr side is in the high resistance state (L/H) in the initial state. FIG. 18D illustrates a characteristic when both the magneto-resistance variable elements are in the high resistance state (H/H) in the initial state. Here, it is assumed that the resistance value of the magneto-resistance variable element on the bit line BL side is 3000Ω in the high resistance state and 1000Ω in the low resistance state, and that the resistance value of the magneto-resistance variable element on the transistor Tr side is 1000Ω in the high resistance state and 500Ω in the low resistance state.

As illustrated in FIG. 18A, when the initial state is "L/L", by only one time of application of a voltage, the state of "L/H" and the state of "H/H" can be obtained but the state of "H/L" cannot be obtained.

Further, as illustrated in FIG. 18B, when the initial state is "H/L", by only one time of application of a voltage, the state of "L/L" and the state of "H/H" can be obtained but the state of "L/H" cannot be obtained.

Further, as illustrated in FIG. 18C, when the initial state is "L/H", by only one time of application of a voltage, the state of "L/L" and the state of "H/H" can be obtained but the state of "H/L" cannot be obtained.

Moreover, as illustrated in FIG. 18D, when the initial state is "H/H", by only one time of application of a voltage, the state of "L/L" and the state of "H/L" can be obtained but the state of "L/H" cannot be obtained.

Therefore, to change the initial state of "L/L" to the state of "H/L", a change to the state of "H/H" is needed in the middle. That is, two times of application of the voltage is needed. Further, to change the initial state of "H/L" to the state of "L/H", a change to the state of "L/L" is needed in the middle. That is, two times of application of the voltage is needed. Further, to change the initial state of "L/H" to the state of "H/L", a change to the state of "H/H" is needed in the middle. That is, two times of application of the voltage is needed. Moreover, to change the initial state of "H/H" to the state of "L/H", a change to the state of "L/L" is needed in the middle. That is, two times of application of the voltage is needed.

Thus, the effects of the above-described embodiments cannot be obtained by combining two magneto-resistance variable elements. A summary of voltages for transition to the respective states is given in Table 2.

TABLE 2

| Initial state | Voltages for transition to respective states | | | |
|---|---|---|---|---|
| | L/L | H/L | L/H | H/H |
| L/L | — | −1.2 V | "via H/H" | −1.7 V |
| H/L | +1.6 V | — | "via L/L" | −1.6 V |
| L/H | +2.8 V | "via H/H" | — | −2.7 V |
| H/H | +1.9 V | "via L/L" | +1.7 V | — |

Figure 19A:
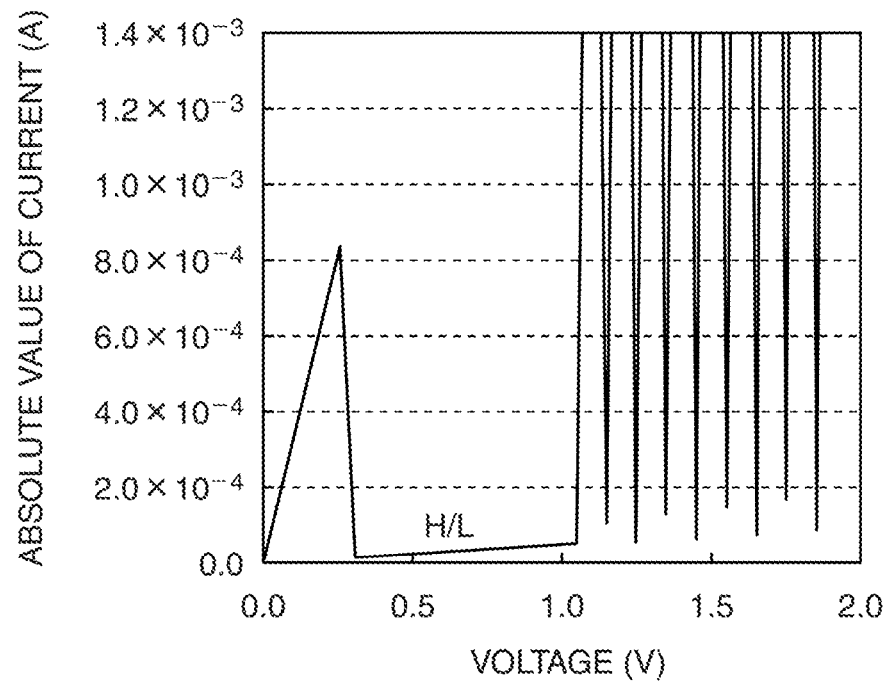
FIG. 19A is a chart illustrating a characteristic when both resistance variable elements are in a low resistance state (L/L) in an initial state.
Figure 19B:
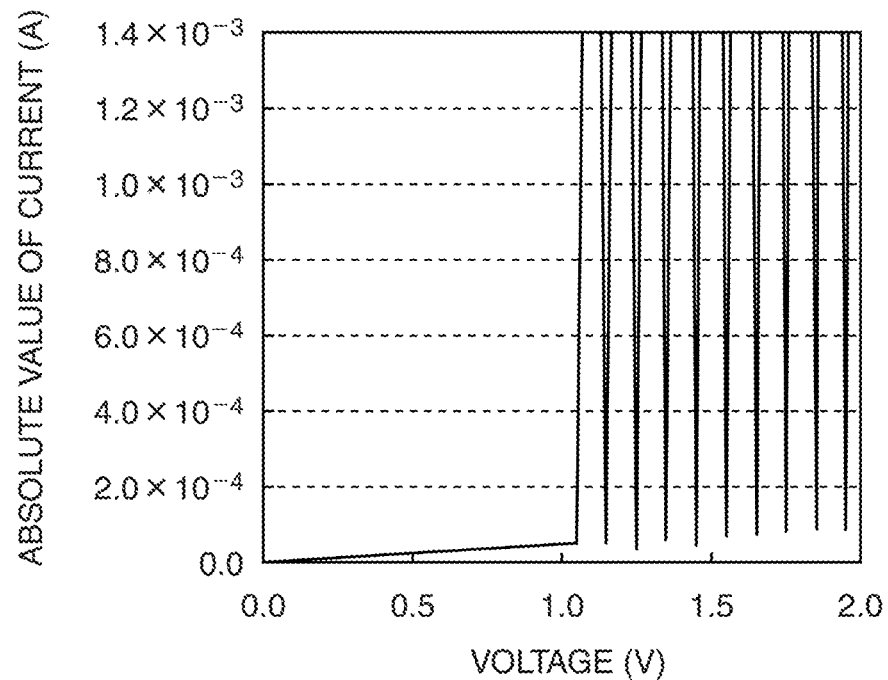
FIG. 19B is a chart illustrating a characteristic when the resistance variable element on the bit line BL side is in a high resistance state and the resistance variable element on the transistor Tr side is in the low resistance state (H/L) in the initial state.
Figure 19C:
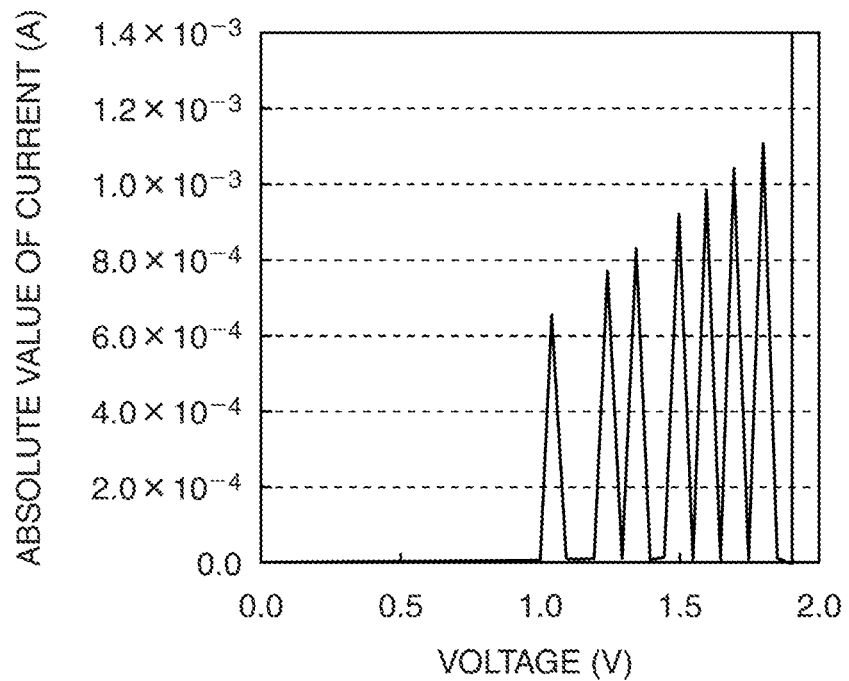
FIG. 19C is a chart illustrating a characteristic when the resistance variable element on the bit line BL side is in the low resistance state and the resistance variable element on the transistor Tr side is in the high resistance state (L/H) in the initial state.
Figure 19D:
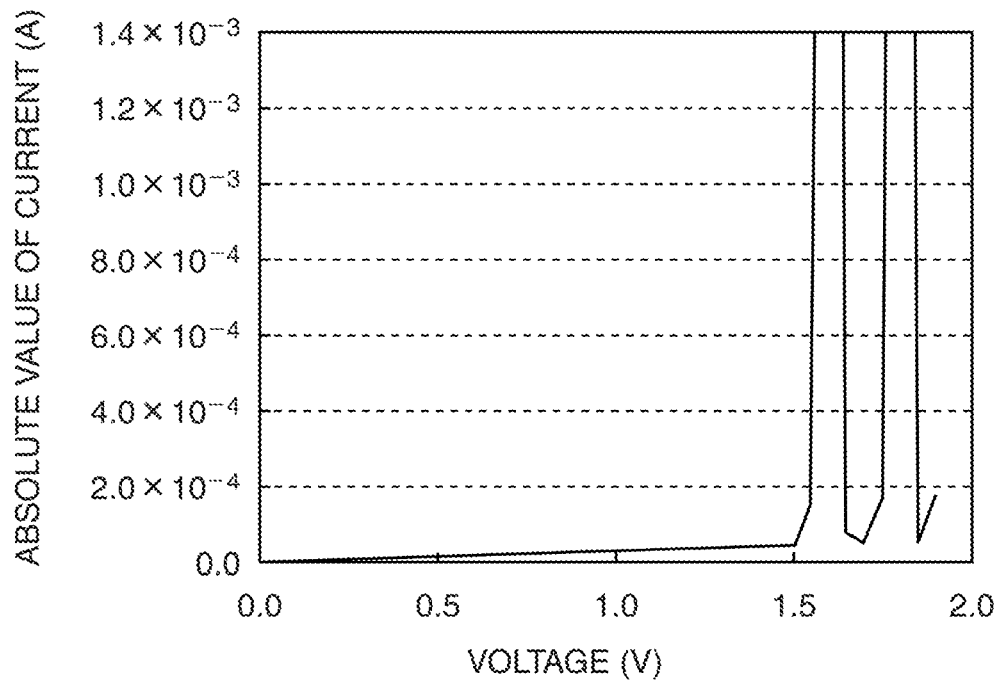
FIG. 19D is a chart illustrating a characteristic when both the resistance variable elements are in the high resistance state (H/H) in the initial state.

Further, control for storing quaternary information by combining two resistance variable elements will be described. FIG. 19A illustrates a characteristic when both the resistance variable elements are in a low resistance state (L/L) in an initial state. FIG. 19B illustrates a characteristic when the resistance variable element on the bit line BL side is in a high resistance state and the resistance variable element on the transistor Tr side is in the low resistance state (H/L) in the initial state. FIG. 19C illustrates a characteristic when the resistance variable element on the bit line BL side is in the low resistance state and the resistance variable element on the transistor Tr side is in the high resistance state (L/H) in the initial state. FIG. 19D illustrates a characteristic when both the resistance variable elements are in the high resistance state (H/H) in the initial state. Here, it is assumed that the resistance value of the resistance variable element on the bit line BL side is 20000Ω in the high resistance state and 200Ω in the low resistance state, and that the resistance value of the resistance variable element on the transistor Tr side is 10000Ω in the high resistance state and 100Ω in the low resistance state.

As illustrated in FIG. 19A, when the initial state is "L/L", by applying a positive voltage the state of "H/L" is obtained at about 0.3 V. However, when the voltage is increased further, it becomes an unstable state at about 1.0 V that both the resistance variable elements repeat the low resistance state and the high resistance state. This is due to the following reason. When the voltage becomes about 1.0 V, the resistance variable element on the bit line BL side changes to the low resistance state again, and the current flowing through the two resistance variable elements increases rapidly. Then, the rapidly increased current causes the resistance of the two resistance variable elements to become high. Accordingly, the current decreases rapidly, the voltage applied to the two resistance variable elements increases accompanying this, and the resistance of the two resistance variable elements becomes low. Such repetition occurs. This phenomenon occurs also when a negative voltage is applied.

Further, as illustrated in FIG. 19B to FIG. 19D, a similar unstable operation occurs when the initial state is "H/L", "L/H", and "H/H".

Accordingly, it is quite difficult to obtain a desired state, and it is not possible to store and read out quaternary information.

Thus, it is not possible to store quaternary information neither by combining two magneto-resistance variable elements nor by combining two resistance variable elements. This is because the two elements forming one composite resistance variable element operate similarly to each other. On the other hand, in the above-described embodiments, the magneto-resistance variable element 1 and the resistance variable element 2, which are different in the resistance varying mechanism, are connected in series in one composite resistance variable element. Thus, four types of resistance states can be obtained easily, and quaternary information can be obtained by simple control.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention has(have) been described in detail, it should be understood that the various changes, substitutions, and alterations could be made hereto without departing from the spirit and scope of the invention.

According to these composite resistance variable elements and the method for manufacturing the same and the like, four types of states of resistance can be obtained by simple control.

What is claimed is:
1. A composite resistance variable element, comprising:
a first resistance variable element that comprises a fixed magnetic layer in which a direction of magnetization is fixed and a free magnetic layer in which a direction of magnetization is variable, a resistance value of the first resistance variable element varying corresponding to the direction of magnetization in the free magnetic layer; and
a second resistance variable element connected in series to the first resistance variable element,
wherein a resistance value of the second resistance variable element varies corresponding to a magnitude of at least one of a voltage applied to the second resistance variable element and a current flowing through the second resistance variable element, irrespective of whether the voltage and the current are positive or negative.
2. The composite resistance variable element according to claim 1, wherein the second resistance variable element com- prises a resistance variable film which is sandwiched by two electrodes and contains an oxide of transition metal.

3. The composite resistance variable element according to claim 1, wherein the second resistance variable element comprises a resistance variable film which is sandwiched by two electrodes and in which a resistance value varies accompanying a phase change.

4. The composite resistance variable element according to claim 1, wherein the first resistance variable element and the second resistance variable element are stacked directly on one another.

5. The composite resistance variable element according to claim 4, wherein the first resistance variable element and the second resistance variable element share one electrode.

6. The composite resistance variable element according to claim 4, wherein one located below out of the first resistance variable element and the second resistance variable element is formed wider than the other one located above.

7. The composite resistance variable element according to claim 5, wherein one located below out of the first resistance variable element and the second resistance variable element is formed wider than the other one located above.

8. The composite resistance variable element according to claim 1, wherein the first resistance variable element and the second resistance variable element are connected via a plug.

9. A semiconductor memory device comprising:
  memory cells, each of the memory cells comprising:
  a first resistance variable element that comprises a fixed magnetic layer in which a direction of magnetization is fixed and a free magnetic layer in which a direction of magnetization is variable, a resistance value of the first resistance variable element varying corresponding to the direction of magnetization in the free magnetic layer; and
  a second resistance variable element connected in series to the first resistance variable element,
  wherein a resistance value of the second resistance variable element varies corresponding to a magnitude of at least one of a voltage applied to the second resistance variable element and a current flowing through the second resistance variable element, irrespective of whether the voltage and the current are positive or negative.

10. The semiconductor memory device according to claim 9, wherein the second resistance variable element comprises a resistance variable film which is sandwiched by two electrodes and contains an oxide of transition metal.

11. The semiconductor memory device according to claim 9, wherein the second resistance variable element comprises a resistance variable film which is sandwiched by two electrodes and in which a resistance value varies accompanying a phase change.

12. The semiconductor memory device according to claim 9, wherein the first resistance variable element and the second resistance variable element are stacked directly on one another.

13. The semiconductor memory device according to claim 12, wherein the first resistance variable element and the second resistance variable element share one electrode.

14. The semiconductor memory device according to claim 12, wherein one located below out of the first resistance variable element and the second resistance variable element is formed wider than the other one located above.

15. The semiconductor memory device according to claim 13, wherein one located below out of the first resistance variable element and the second resistance variable element is formed wider than the other one located above.

16. The semiconductor memory device according to claim 9, wherein the first resistance variable element and the second resistance variable element are connected via a plug.

17. A method for manufacturing a composite resistance variable element, comprising:
  forming a first resistance variable element that comprises a fixed magnetic layer in which a direction of magnetization is fixed and a free magnetic layer in which a direction of magnetization is variable, a resistance value of the first resistance variable element varying corresponding to the direction of magnetization in the free magnetic layer; and
  forming a second resistance variable element connected in series to the first resistance variable element,
  wherein a resistance value of the second resistance variable element varies corresponding to a magnitude of at least one of a voltage applied to the second resistance variable element and a current flowing through the second resistance variable element, irrespective of whether the voltage and the current are positive or negative.

18. The method for manufacturing a composite resistance variable element according to claim 17, wherein the first resistance variable element and the second resistance variable element are stacked directly on one another.

19. The method for manufacturing a composite resistance variable element according to claim 18, wherein one located below out of the first resistance variable element and the second resistance variable element is formed wider than the other one located above.

20. The method for manufacturing a composite resistance variable element according to claim 17, further comprising forming a plug connecting the first resistance variable element and the second resistance variable element.

* * * * *